(12) United States Patent
Takizawa

(10) Patent No.: US 11,714,101 B2
(45) Date of Patent: Aug. 1, 2023

(54) INERTIAL SENSOR, ELECTRONIC APPARATUS, AND VEHICLE

(71) Applicant: SEIKO EPSON CORPORATION, Tokyo (JP)

(72) Inventor: Teruo Takizawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 308 days.

(21) Appl. No.: 16/802,137

(22) Filed: Feb. 26, 2020

(65) Prior Publication Data

US 2020/0278377 A1 Sep. 3, 2020

(30) Foreign Application Priority Data

Feb. 28, 2019 (JP) ................................. 2019-036744

(51) Int. Cl.
| | | |
|---|---|---|
| *G01C 19/00* | (2013.01) | |
| *G01C 19/5783* | (2012.01) | |
| *G01P 15/125* | (2006.01) | |
| *G01P 15/18* | (2013.01) | |
| *G01C 19/5719* | (2012.01) | |
| *G01C 21/16* | (2006.01) | |

(52) U.S. Cl.
CPC ........ *G01P 15/125* (2013.01); *G01C 19/5719* (2013.01); *G01P 15/18* (2013.01); *G01C 21/16* (2013.01)

(58) Field of Classification Search
None
See application file for complete search history.

(56) References Cited

U.S. PATENT DOCUMENTS

| | | | |
|---|---|---|---|
| 9,321,627 B2 | 4/2016 | Furuhata | |
| 9,764,940 B2 | 9/2017 | Tanaka | |
| 9,823,071 B2 | 11/2017 | Aoki | |
| 2001/0008089 A1* | 7/2001 | Abe | B81B 7/007 |
| | | | 73/504.16 |
| 2007/0031638 A1* | 2/2007 | Okumura | B81B 3/0086 |
| | | | 428/141 |
| 2009/0183568 A1* | 7/2009 | Yamanaka | G01P 15/125 |
| | | | 73/504.04 |
| 2015/0268266 A1* | 9/2015 | Furuhata | G01C 19/5783 |
| | | | 73/504.03 |

FOREIGN PATENT DOCUMENTS

| | | | | |
|---|---|---|---|---|
| CN | 107063225 A | * | 8/2017 | ............ B81B 7/007 |
| JP | H11-211482 | | 8/1999 | |
| JP | 2001330442 A | * | 11/2001 | ......... G01C 19/5719 |
| JP | 2015-177153 | | 10/2015 | |

(Continued)

*Primary Examiner* — Jill E Culler
*Assistant Examiner* — Ruben C Parco, Jr.
(74) *Attorney, Agent, or Firm* — Workman Nydegger

(57) ABSTRACT

An inertial sensor includes a substrate, a first inertial sensor element provided on the substrate, a lid bonded to the substrate so as to cover the first inertial sensor element, a first drive signal terminal that is provided outside the lid and is for a drive signal to be applied to the first inertial sensor element, and a first detection signal terminal that is provided outside the lid and is for a detection signal output from the first inertial sensor element, in which, in plan view of the substrate, the first drive signal terminal and the first detection signal terminal are provided with the lid interposed therebetween.

12 Claims, 23 Drawing Sheets

(56) References Cited

FOREIGN PATENT DOCUMENTS

| JP | 2015-206648 | | 11/2015 | |
| JP | 2016133472 A | * | 7/2016 | |
| JP | 2017-173074 | | 9/2017 | |
| JP | 2018-169406 | | 11/2018 | |
| WO | WO-9521383 A1 | * | 8/1995 | ......... G01C 19/5719 |
| WO | WO-2010103093 A1 | * | 9/2010 | ........... G01C 19/574 |

* cited by examiner

FIG. 12
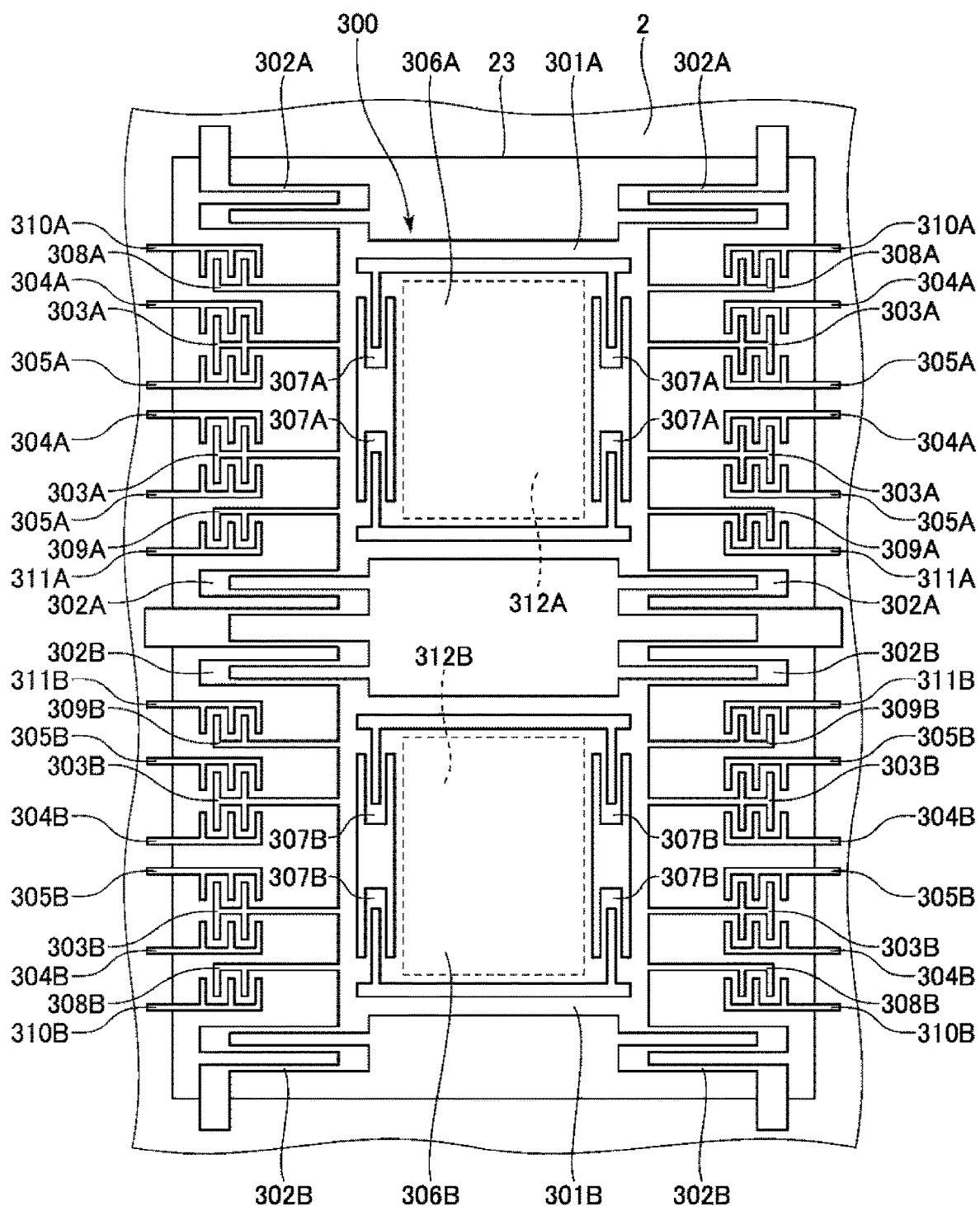
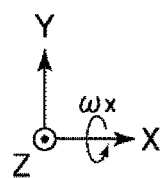

INERTIAL SENSOR, ELECTRONIC APPARATUS, AND VEHICLE

The present application is based on, and claims priority from JP Application Serial Number 2019-036744, filed Feb. 28, 2019, the disclosure of which is hereby incorporated by reference herein in its entirety.

BACKGROUND

1. Technical Field

The present disclosure relates to an inertial sensor, an electronic apparatus, and a vehicle.

2. Related Art

The inertial sensor described in JP-A-2015-177153 includes a substrate, a three-axis acceleration sensor element and a three-axis angular velocity sensor element that are provided on the substrate and disposed side by side in the Y-axis direction, and a lid that covers the three-axis acceleration sensor element and the three-axis angular velocity sensor element and is bonded to the substrate. The three-axis acceleration sensor element includes an X-axis acceleration sensor element that detects acceleration in the X-axis direction, a Y-axis acceleration sensor element that detects acceleration in the Y-axis direction, and a Z-axis acceleration sensor element that detects acceleration in the Z-axis direction, and these three sensor elements are disposed side by side in the X-axis direction. Similarly, the three-axis angular velocity sensor element includes an X-axis angular velocity sensor element that measures an angular velocity around the X-axis, a Y-axis angular velocity sensor element that measures an angular velocity around the Y-axis, and a Z-axis angular velocity sensor element that measures an angular velocity around the Z-axis, and these three sensor elements are disposed side by side in the X-axis direction.

However, in the inertial sensor of JP-A-2015-177153, a plurality of terminals electrically coupled to the X-axis acceleration sensor element, a plurality of terminals electrically coupled to the Y-axis acceleration sensor element, and a plurality of terminals electrically coupled to the Z-axis acceleration sensor element are respectively provided at the same side with respect to the lid, that is, on the minus side in the Y-axis direction in the illustrated configuration. A plurality of terminals electrically coupled to the X-axis angular velocity sensor element, a plurality of terminals electrically coupled to the Y-axis angular velocity sensor element, and a plurality of terminals electrically coupled to the Z-axis angular velocity sensor element are respectively provided at the same side with respect to the lid, that is, on the plus side in the Y-axis direction in the illustrated configuration.

The X-axis acceleration sensor element includes, as the plurality of terminals, a drive signal terminal for a drive signal applied to the X-axis acceleration sensor element and a detection signal terminal for a detection signal output from the X-axis acceleration sensor element, and if these terminals are disposed on the same side with respect to the lid, these terminals are close to each other, the drive signal may be mixed into the detection signal as noise, and the S/N ratio of the detection signal may be reduced. The same applies to other Y-axis acceleration sensor element, Z-axis acceleration sensor element, X-axis angular velocity sensor element, Y-axis angular velocity sensor element, and Z-axis angular velocity sensor element.

In particular, when a differential charge amplifier is used in a detection circuit scheme, if a drive signal terminal is present near the detection signal terminal, the charge to be detected may be adversely affected. In a high accuracy sensor used in an inertia measurement device or the like, a reduction in the S/N ratio of a detection signal due to a drive signal was a big problem. For that reason, it is desired to improve reliability of the detection signal.

SUMMARY

An inertial sensor according to an aspect of the disclosure includes a substrate, a first inertial sensor element provided on the substrate, a lid bonded to the substrate so as to cover the first inertial sensor element, a first drive signal terminal that is provided outside the lid and is for a drive signal to be applied to the first inertial sensor element, and a first detection signal terminal that is provided outside the lid and is for a detection signal output from the first inertial sensor element, in which, in plan view of the substrate, the first drive signal terminal and the first detection signal terminal are provided with the lid interposed therebetween.

BRIEF DESCRIPTION OF THE DRAWINGS

FIG. 12 is a plan view illustrating an example of a sensor element that measures an angular velocity around the X-axis.

DESCRIPTION OF EXEMPLARY EMBODIMENTS

Hereinafter, an inertial sensor, an electronic apparatus, and a vehicle according to the present disclosure will be described in detail based on embodiments illustrated in the accompanying drawings.

First Embodiment

Figure 1:
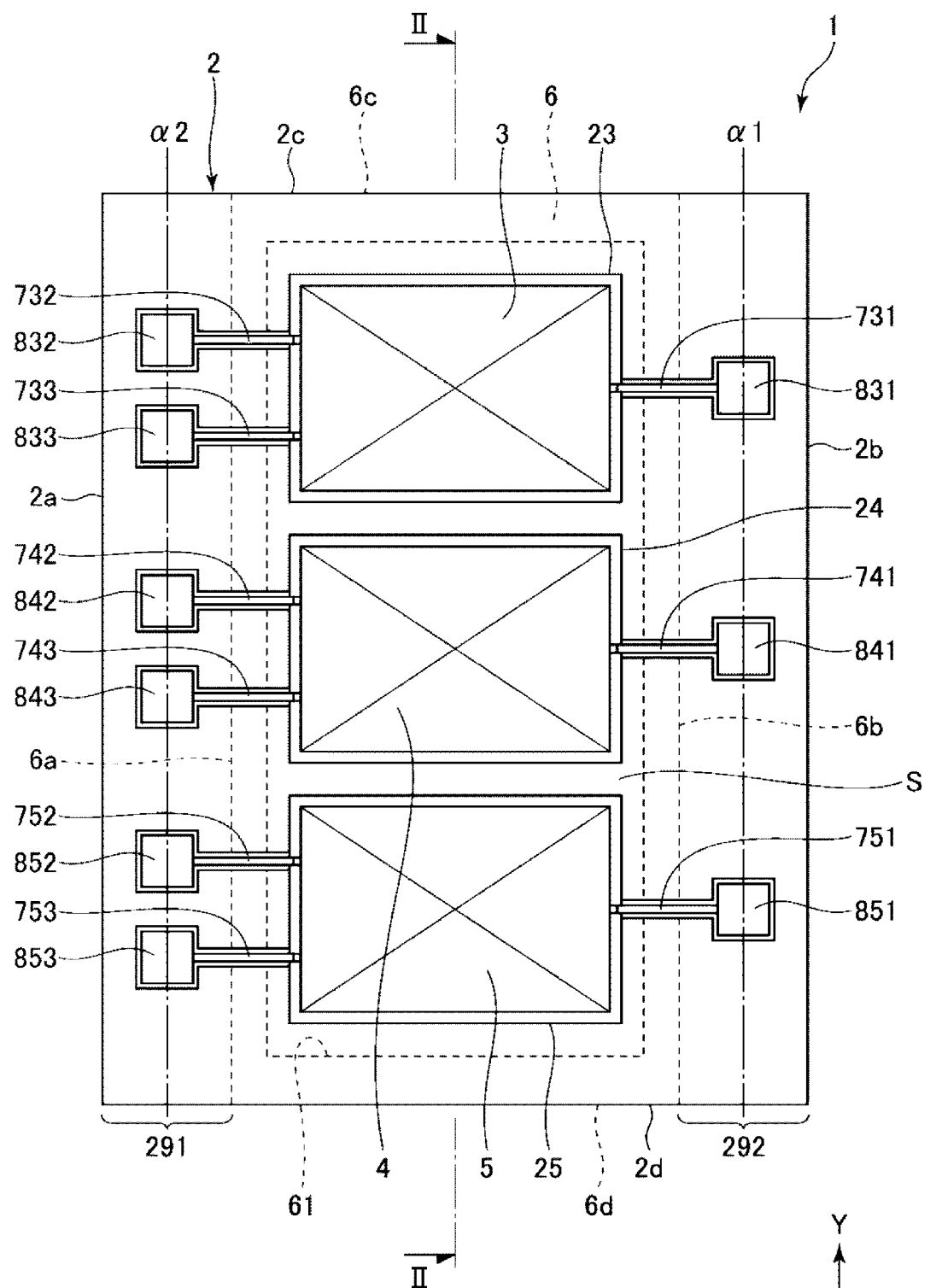
FIG. 1 is a plan view illustrating an inertial sensor according to a first embodiment.
Figure 2:
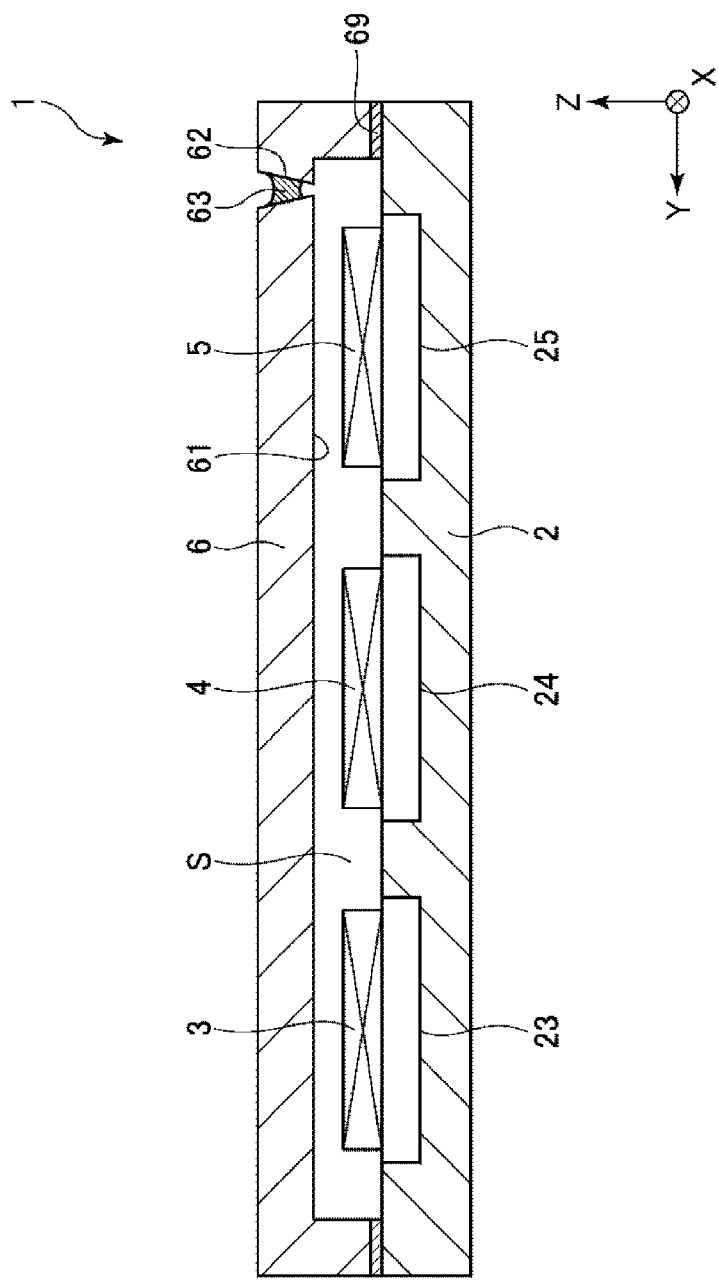
FIG. 2 is a cross-sectional view taken along line II-II in FIG. 1.
Figure 3:
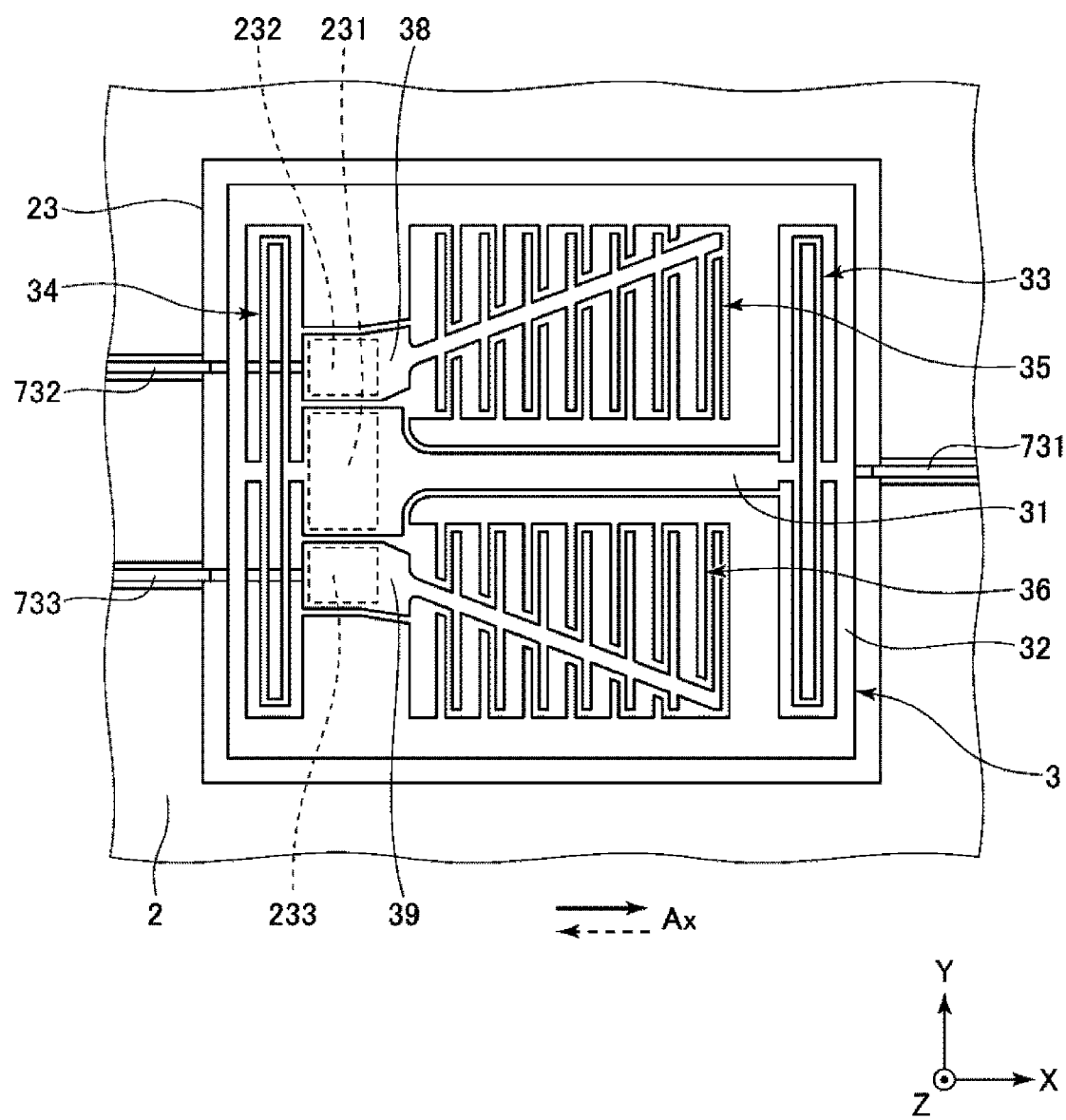
FIG. 3 is a plan view illustrating an example of a sensor element that measures acceleration in the X-axis direction.
Figure 4:
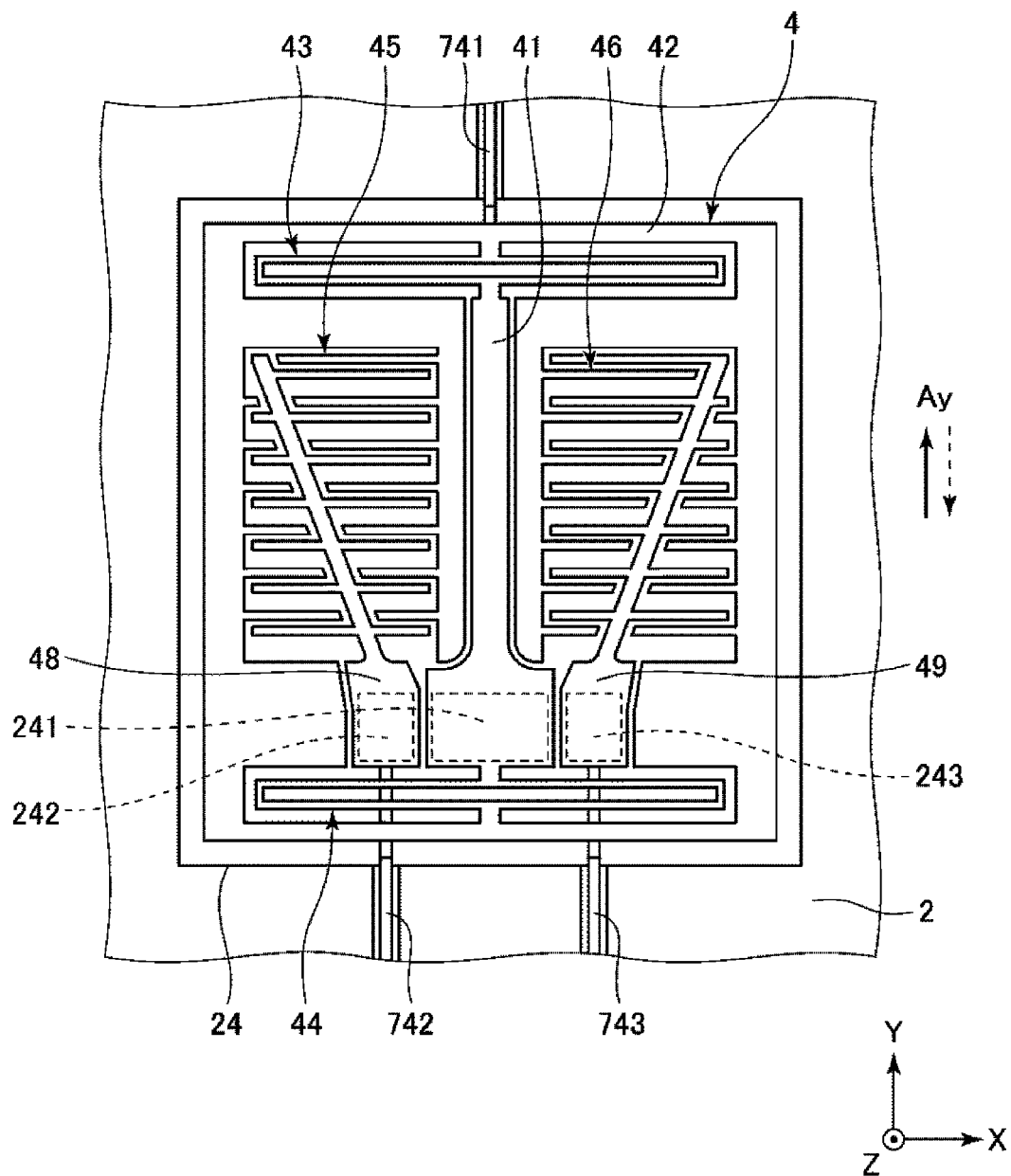
FIG. 4 is a plan view illustrating an example of a sensor element that measures acceleration in the Y-axis direction.
Figure 5:
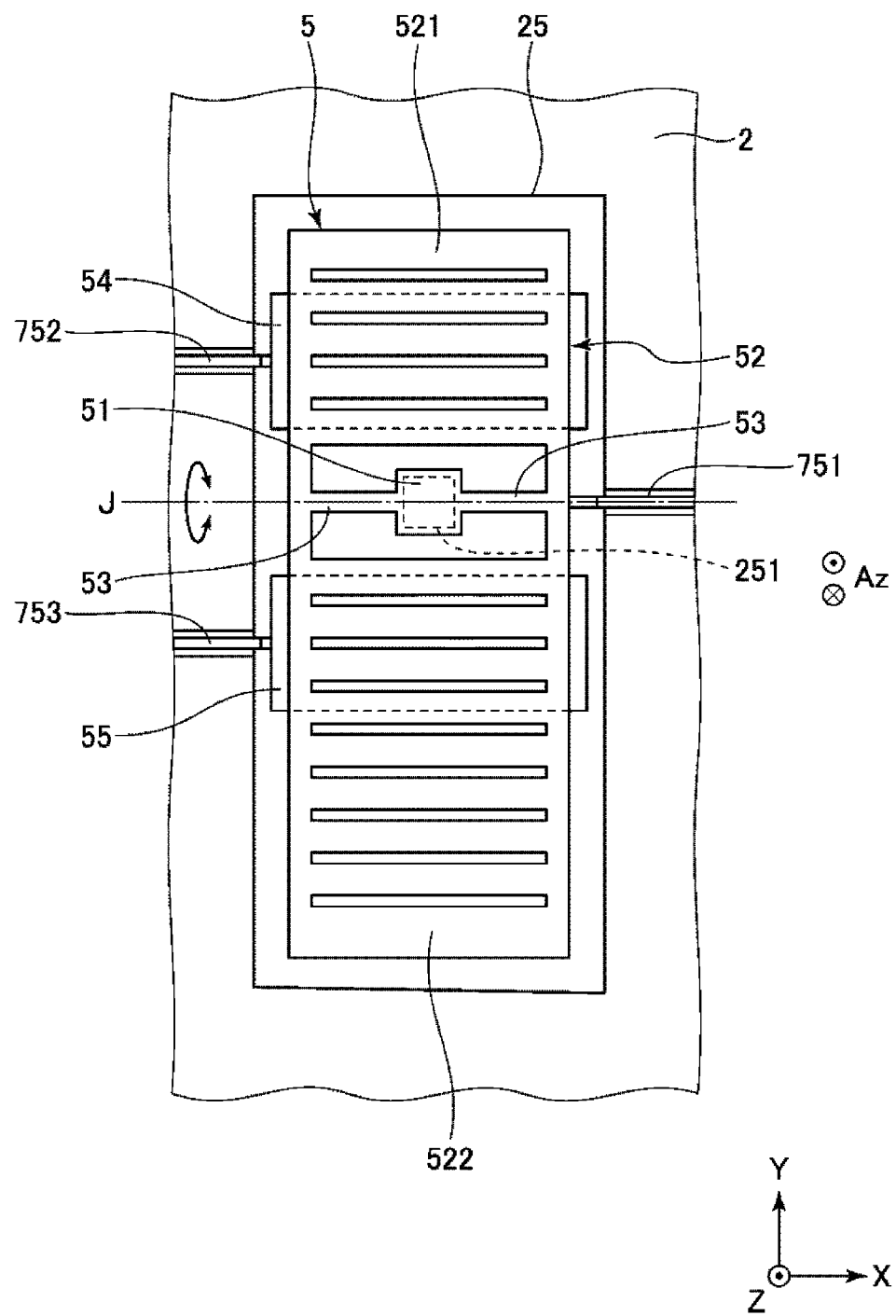
FIG. 5 is a plan view illustrating an example of a sensor element that measures acceleration in the Z-axis direction.
Figure 6:
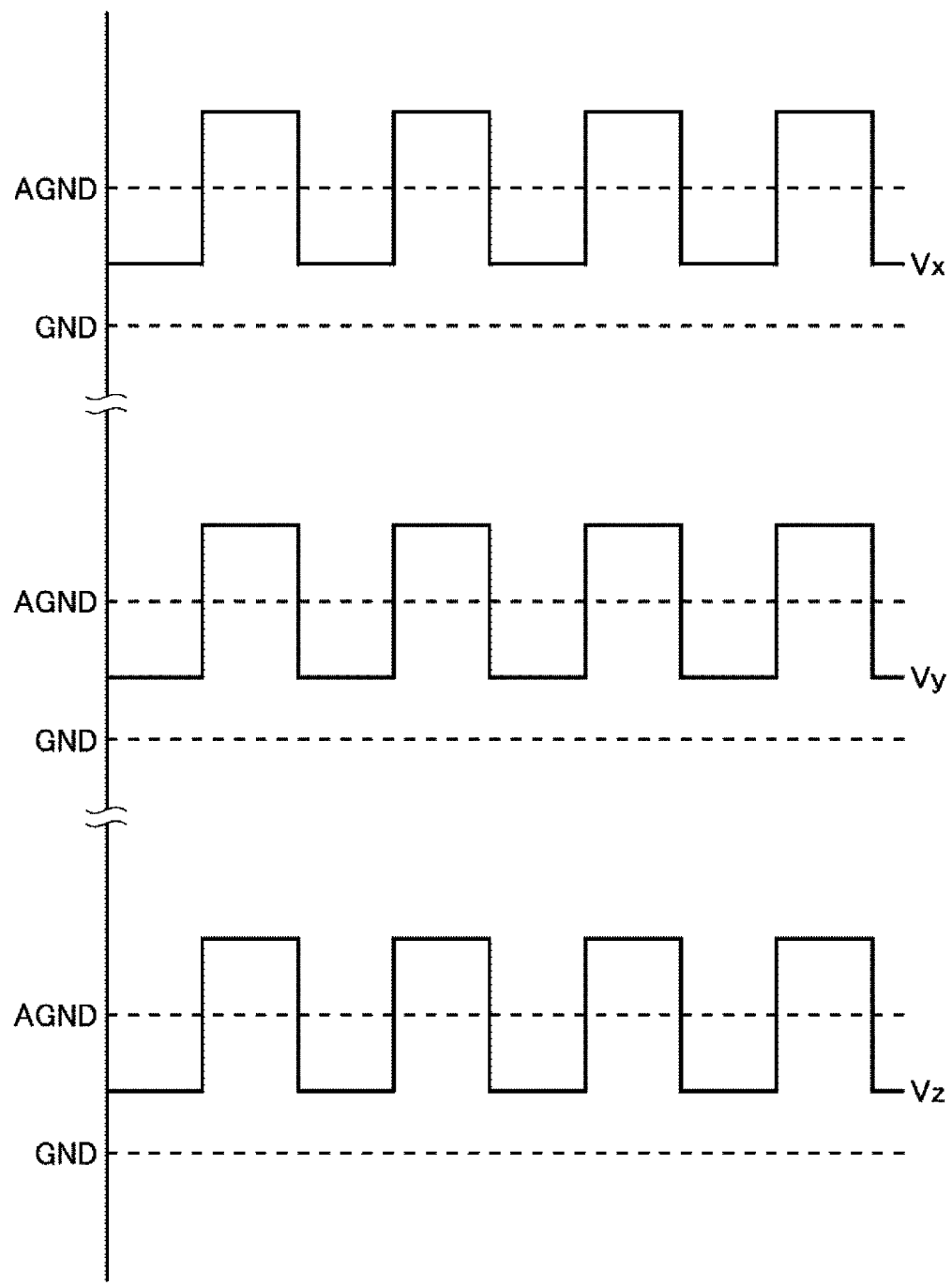
FIG. 6 is a graph illustrating an example of a drive voltage applied to each sensor element.

FIG. 1 is a plan view illustrating an inertial sensor according to a first embodiment. FIG. 2 is a cross-sectional view taken along line II-II in FIG. 1. FIG. 3 is a plan view illustrating an example of a sensor element that measures acceleration in the X-axis direction. FIG. 4 is a plan view illustrating an example of a sensor element that measures acceleration in the Y-axis direction. FIG. 5 is a plan view illustrating an example of a sensor element that measures acceleration in the Z-axis direction. FIG. 6 is a graph illustrating an example of a drive voltage applied to each sensor element.

In each drawing excluding FIG. 6, the X-axis, Y-axis, and Z-axis are illustrated as three axes orthogonal to each other. A direction along the X-axis, that is, a direction parallel to the X-axis is referred to as an "X-axis direction", a direction along the Y-axis is referred to as a "Y-axis direction", and a direction along the Z-axis is referred to as a "Z-axis direction". A tip end side of the arrow of each axis is also referred to as a "plus side", and the opposite side is also referred to as a "minus side". In addition, the plus side in the Z-axis direction is also referred to as "upper", and the minus side in the Z-axis direction is also referred to as "lower". In the specification of the present application, the term "orthogonal to" includes not only a case where constituent elements intersect at 90° but also a case where the constituent elements intersect at an angle slightly inclined from 90°, for example, within a range of 90°±5°.

The inertial sensor 1 illustrated in FIG. 1 is an acceleration sensor that can independently measure accelerations in the X-axis direction, the Y-axis direction, and the Z-axis direction that are orthogonal to each other. Such an inertial sensor 1 includes a substrate 2, three sensor elements 3, 4, and 5 disposed on the substrate 2, and a lid 6 that accommodates the sensor elements 3, 4, and 5 and is bonded to the substrate 2. The functions of the three sensor elements 3, 4, and 5 are as follows: the sensor element 3 (first inertial sensor element) measures the acceleration Ax in the X-axis direction, the sensor element 4 (second inertial sensor element) measures the acceleration Ay in the Y-axis direction, and the sensor element 5 (third inertial sensor element) measures an acceleration Az in the Z-axis direction. In FIG. 1, for convenience of explanation, the sensor elements 3, 4, and 5 are illustrated in a simplified manner.

A configuration of the inertial sensor 1 is not limited to the configuration described above, and, for example, an arrangement, shape, function, and the like of the sensor elements 3, 4, and 5 may be different from the illustrated configuration. For example, one or two of the sensor elements 3, 4, and 5 may be omitted. A sensor element that can measure the angular velocity may be used instead of or in addition to the sensor elements 3, 4, and 5.

As illustrated in FIG. 1, the substrate 2 is rectangular, that is, a quadrangle in plan view from the Z-axis direction, and has a rectangular shape having a pair of sides 2a and 2b extending in the Y-axis direction and a pair of sides 2c and 2d extending in the X-axis direction. However, the shape of the substrate 2 in plan view is not particularly limited, and may be, for example, a polygon other than a rectangle, a circle, an irregular shape, or the like. The substrate 2 includes three concave portions 23, 24, and 25 that open to the upper surface. The sensor element 3 is provided so as to overlap the concave portion 23, the sensor element 4 is provided so as to overlap the concave portion 24, and the sensor element 5 is provided so as to overlap the concave portion 25. Contact between the sensor elements 3, 4, and 5 and the substrate 2 is suppressed by these concave portions 23, 24, and 25.

As such a substrate 2, for example, a glass substrate made of a glass material containing alkali metal ions such as sodium ions, specifically, borosilicate glass such as Tempax glass and Pyrex glass (both registered trademark) can be used. However, a constituent material of the substrate 2 is not particularly limited, and a silicon substrate, a ceramic substrate, and the like may be used.

As illustrated in FIG. 1, the lid 6 is rectangular in plan view, and has a rectangular shape having a pair of sides 6a and 6b extending in the Y-axis direction, and a pair of sides 6c and 6d extending in the X-axis direction. However, the shape of the lid 6 in plan view is not particularly limited, and may be, for example, a polygon other than a rectangle, a circle, an irregular shape, or the like. The lid 6 also has a concave portion 61 that opens to the lower surface. As illustrated in FIG. 2, the lid 6 is bonded to the upper surface of the substrate 2 with the sensor elements 3, 4, and 5 accommodated in the concave portion 61 formed inside thereof. The lid 6 and the substrate 2 form an accommodation space S in which the sensor elements 3, 4, and 5 are airtightly accommodated. As such, the accommodation space S with high airtightness can be formed by directly bonding the lid 6 to the substrate 2. The lid 6 is provided with a through-hole 62 that communicates the inside and outside of the accommodation space S and after the accommodation space S is made to have a desired atmosphere through the through-hole 62, the through-hole 62 is sealed with a sealing material 63.

The accommodation space S may be filled with inert gas such as nitrogen, helium, or argon, and may be at approximately atmospheric pressure at an operating temperature (for example, approximately −40° C. to +85° C.). By setting the accommodation space S to atmospheric pressure, viscous resistance is increased and a damping effect is exhibited, so that vibrations of the sensor elements 3, 4, and 5 can be quickly converged. For that reason, a detection accuracy of the inertial sensor 1 is improved.

As such a lid 6, for example, a silicon substrate can be used. However, the constituent material of the lid 6 is not particularly limited, and for example, a glass substrate or a ceramic substrate may be used as the lid 6. Although a bonding method between the substrate 2 and the lid 6 is not particularly limited and may be appropriately selected depending on the materials of the substrate 2 and the lid 6, in the first embodiment, the substrate 2 and the lid 6 are bonded through a bonding member 69 formed over the circumference of the lower surface of the lid 6. As the bonding member 69, for example, a glass frit material which is low melting point glass can be used.

As illustrated in FIG. 1, the lid 6 is disposed concentrically and in the same center as the substrate 2, the sides 6c and 6d coincide with the sides 2c and 2d of the substrate 2, and the side 6a is positioned at the plus side in the X-axis direction from the side 2a, and the side 6b is positioned at the minus side in the-X axis direction from the side 2b. An end portion on the minus side in the X-axis direction of the substrate 2 is exposed from the lid 6 and an end portion on the plus side in the X-axis direction of the substrate 2 is exposed from the lid 6. Hereinafter, the exposed portion, specifically, the portion between the side 2a and the side 6a is also referred to as an "exposed portion 291", and the portion between the side 2b and the side 6b is also referred to as an "exposed portion 292".

The substrate 2 has a groove which opens to the upper surface thereof, and a plurality of wirings 731, 732, 733, 741, 742, 743, 751, 752, and 753 and terminals 831, 832, 833, 841, 842, 843, 851, 852, and 853 are disposed in the groove. The wirings 731, 732, 733, 741, 742, 743, 751, 752, and 753 are disposed inside and outside of the accommodation space S, and, among these wirings, the wirings 731, 732, and 733 are electrically coupled to the sensor element 3, the wirings 741, 742, and 743 are electrically coupled to the sensor element 4, and the wirings 751, 752, and 753 are electrically coupled to the sensor element 5.

The terminals 831, 832, 833, 841, 842, 843, 851, 852, and 853 are disposed on the exposed portions 291 and 292, that is, outside the lid 6. Then, the terminal 831 is electrically coupled to the wiring 731, the terminal 832 is electrically coupled to the wiring 732, the terminal 833 is electrically coupled to the wiring 733, the terminal 841 is electrically coupled to the wiring 741, The terminal 842 is electrically coupled to the wiring 742, the terminal 843 is electrically coupled to the wiring 743, the terminal 851 is electrically coupled to the wiring 751, the terminal 852 is electrically coupled to the wiring 752, and the terminal 853 is electrically coupled to the wiring 753.

The wirings 731, 732, 733, 741, 742, 743, 751, 752, and 753 and the terminals 831, 832, 833, 841, 842, 843, 851, 852, and 853 are each made of a metal film. With this configuration, the configurations of the wirings and terminals become simple. Examples of the constituent materials include metal materials such as gold (Au), silver (Ag), platinum (Pt), palladium (Pd), iridium (Ir), copper (Cu), aluminum (Al), nickel (Ni), chromium (Cr), Ti (titanium) and tungsten (W) and alloys containing these metal materials.

Next, the sensor elements 3, 4, and 5 will be described with reference to FIGS. 3 to 5. The sensor elements 3, 4, and 5 can be collectively formed by, for example, anodically bonding a silicon substrate doped with impurities such as phosphorus (P), boron (B), and arsenic (As) to the upper surface of the substrate 2 and patterning the silicon substrate by a Bosch process that is a deep groove etching technique. However, the method of forming the sensor elements 3, 4, and 5 is not limited thereto.

The sensor element 3 can measure the acceleration Ax in the X-axis direction. As such a sensor element 3, for example, as illustrated in FIG. 3, the sensor element 3 includes a fixed portion 31 fixed to a mount 231 protruding from the bottom surface of the concave portion 23, a movable body 32 displaceable in the X-axis direction with respect to the fixed portion 31, springs 33 and 34 coupling the fixed portion 31 and the movable body 32, a first movable electrode 35 and a second movable electrode 36 provided in the movable body 32, a first fixed electrode 38 fixed to a mount 232 protruding from the bottom surface of the concave portion 23 and facing the first movable electrode 35, and a second fixed electrode 39 fixed to amount 233 protruding from the bottom surface of the concave portion 23 and facing the second movable electrode 36.

The first and second movable electrodes 35 and 36 are electrically coupled to the wiring 731 in the fixed portion 31, the first fixed electrode 38 is electrically coupled to the wiring 732, and the second fixed electrode 39 is electrically coupled to the wiring 733. Then, for example, a drive signal Vx in which a DC voltage and an AC voltage as illustrated in FIG. 6 are superimposed is applied to the first and second movable electrodes 35 and 36 through the terminal 831. On the other hand, a fixed voltage AGND (analog ground) is applied to the first and second fixed electrodes 38 and 39, and the first and second fixed electrodes 38 and 39 are coupled to a charge amplifier through the terminals 832 and 833. For that reason, capacitance Cx1 is formed between the first movable electrode 35 and the first fixed electrode 38 and capacitance Cx2 is formed between the second movable electrode 36 and the second fixed electrode 39. When a potential difference is generated between the drive signal Vx and the fixed voltage AGND, charges corresponding to the voltage difference are induced between the first movable electrode 35 and the first fixed electrode 38 and between the second movable electrode 36 and the second fixed electrode 39. When a charge amount induced between the first movable electrode 35 and the first fixed electrode 38 and a charge amount induced between the second movable electrode 36 and the second fixed electrode 39 are the same, a voltage value generated in the charge amplifier is zero. This represents that the acceleration Ax applied to the sensor element 3 is zero (stationary state).

Then, when the acceleration Ax is applied to the sensor element 3 in a state where the capacitances Cx1 and Cx2 are formed, the movable body 32 is displaced in the X-axis direction, and accordingly, the capacitances Cx1 and Cx2 change in opposite phases. For that reason, the charge amount induced between the first movable electrode 35 and the first fixed electrode 38 and the charge amount induced between the second movable electrode 36 and the second fixed electrode 39 also change, based on the change (differential operation) in the capacitances Cx1 and Cx2. When a difference occurs between the charge amount induced between the first movable electrode 35 and the first fixed electrode 38 and the charge amount induced between the second movable electrode 36 and the second fixed electrode 39, the difference is output as the voltage value of the charge amplifier. In this way, the acceleration Ax received by the sensor element 3 can be obtained.

The sensor element 4 can measure the acceleration Ay in the Y-axis direction. Such a sensor element 4 is not particularly limited, but, for example, as illustrated in FIG. 4, can be configured by rotating the sensor element 3 described above by 90 degrees around the Z-axis. That is, the sensor element 4 includes a fixed portion 41 fixed to a mount 241 protruding from the bottom surface of the concave portion 24, a movable body 42 displaceable in the Y-axis direction with respect to the fixed portion 41, springs 43 and 44 coupling the fixed portion 41 and the movable body 42, a first movable electrode 45 and a second movable electrode 46 provided in the movable body 42, a first fixed electrode 48 fixed to a mount 242 protruding from the bottom surface of the concave portion 24 and facing the first movable electrode 45, and a second fixed electrode 49 fixed to a mount 243 protruding from the bottom surface of the concave portion 24 and facing the second movable electrode 46.

The first and second movable electrodes 45 and 46 are electrically coupled to the wiring 741 in the fixed portion 41, the first fixed electrode 48 is electrically coupled to the wiring 742, and the second fixed electrode 49 is electrically coupled to the wiring 743. Then, for example, a drive signal Vy in which a DC voltage and an AC voltage as illustrated in FIG. 6 are superimposed is applied to the first and second movable electrodes 45 and 46 through the terminal 841. On the other hand, the fixed voltage AGND (analog ground) is applied to the first and second fixed electrodes 48 and 49, and the first and second fixed electrodes 48 and 49 are coupled to the charge amplifier through the terminals 842 and 843. For that reason, capacitance Cy1 is formed between the first movable electrode 45 and the first fixed electrode 48 and capacitance Cy2 is formed between the second movable electrode 46 and the second fixed electrode 49. When a potential difference is generated between the drive signal Vy and the fixed voltage AGND, charges corresponding to the voltage difference are induced between the first movable electrode 45 and the first fixed electrode 48 and between the second movable electrode 46 and the second fixed electrode 49. When a charge amount induced between the first movable electrode 45 and the first fixed electrode 48 and a charge amount induced between the second movable electrode 46 and the second fixed electrode 49 are the same, a voltage value generated in the charge amplifier is zero. This represents that the acceleration Ay applied to the sensor element 4 is zero (stationary state).

Then, when the acceleration Ay is applied to the sensor element 4 in a state where the capacitances Cy1 and Cy2 are formed, the movable body 42 is displaced in the Y-axis direction, and accordingly, the capacitances Cy1 and Cy2 change in opposite phases. For that reason, the charge amount induced between the first movable electrode 45 and the first fixed electrode 48 and the charge amount induced between the second movable electrode 46 and the second fixed electrode 49 also change, based on the change (differential operation) in the capacitances Cy1 and Cy2. When a difference occurs between the charge amount induced between the first movable electrode 45 and the first fixed electrode 48 and the charge amount induced between the second movable electrode 46 and the second fixed electrode 49, the difference is output as the voltage value of the charge amplifier. In this way, the acceleration Ay received by the sensor element 4 can be obtained.

The sensor element 5 can measure the acceleration Az in the Z-axis direction. Such a sensor element 5 is not particularly limited, but, for example, as illustrated in FIG. 5, includes a fixed portion 51 fixed to a mount 251 protruding from the bottom surface of the concave portion 25 and a movable body 52 that is coupled to the fixed portion 51 through a beam 53 and is swingable around a swing axis J along the X-axis with respect to the fixed portion 51. In the movable body 52, the first movable portion 521 positioned at one side of the swing shaft J and the second movable portion 522 positioned at the other side thereof have different rotational moments around the swing shaft J. The sensor element 5 is disposed on the bottom surface of the concave portion 25, and includes a first fixed electrode 54 disposed to face the first movable portion 521 and a second fixed electrode 55 disposed to face the second movable portion 522.

The movable body 52 is electrically coupled to the wiring 751 in the fixed portion 51, the first fixed electrode 54 is electrically coupled to the wiring 752, and the second fixed electrode 55 is electrically coupled to the wiring 753. Then, for example, a drive signal Vz in which a DC voltage and an AC voltage as illustrated in FIG. 6 are superimposed is applied to the movable body 52 through the terminal 851. On the other hand, the fixed voltage AGND (analog ground) is applied to the first and second fixed electrodes 54 and 55, and the first and second fixed electrodes 54 and 55 are coupled to the charge amplifier through the terminals 852 and 853. For that reason, capacitance Cz1 is formed between the first movable portion 521 and the first fixed electrode 54 and capacitance Cz2 is formed between the second movable portion 522 and the second fixed electrode 55. When a potential difference is generated between the drive signal Vz and the fixed voltage AGND, charges corresponding to the voltage difference are induced between the first movable portion 521 and the first fixed electrode 54 and between the second movable portion 522 and the second fixed electrode 55. When a charge amount induced between the first movable portion 521 and the first fixed electrode 54 and a charge amount induced between the second movable portion 522 and the second fixed electrode 55 are the same, a voltage value generated in the charge amplifier is zero. This represents that the acceleration Az applied to the sensor element 5 is zero (stationary state).

Then, when the acceleration Az is applied to the sensor element 5 in a state where the capacitances Cz1 and Cz2 are formed, the movable body 52 is displaced around the swing axis J, and accordingly, the capacitances Cz1 and Cz2 change in opposite phases. For that reason, the charge amount induced between the first movable portion 521 and the first fixed electrode 54 and the charge amount induced between the second movable portion 522 and the second fixed electrode 55 also change, based on the change (differential operation) in the capacitances Cz1 and Cz2. When a difference occurs between the charge amount induced between the first movable portion 521 and the first fixed electrode 54 and the charge amount induced between the second movable portion 522 and the second fixed electrode 55, the difference is output as the voltage value of the charge amplifier. In this way, the acceleration Az received by the sensor element 5 can be obtained.

Although the sensor elements 3, 4, and 5 have been described as above, the configurations of the sensor elements 3, 4, and 5 are not particularly limited as long as the accelerations Ax, Ay, and Az can be detected, respectively.

Next, the disposition of the terminals 831, 832, 833, 841, 842, 843, 851, 852, and 853 will be described in more detail. As described above, the terminals 831, 832, 833, 841, 842, 843, 851, 852, and 853 are respectively disposed on the exposed portions 291 and 292 of the substrate 2. That is, the terminals 831, 832, 833, 841, 842, 843, 851, 852, and 853 are disposed separately on one side and the other side in the X-axis direction with respect to the lid 6.

The terminals 831, 832, and 833 are electrically coupled to the sensor element 3, respectively. The terminal 831 is a first drive signal terminal for inputting the drive signal Vx to be applied to the sensor element 3, and the terminals 832 and 833 are first detection signal terminals for detecting detection signals output from the sensor element 3, that is, charges induced in the capacitances Cx1 and Cx2. Hereinafter, for convenience of explanation, the terminal 831 is also referred to as a "first drive signal terminal 831", and the terminals 832 and 833 are also referred to as "first detection signal terminals 832 and 833".

Similarly, the terminals 841, 842, and 843 are electrically coupled to the sensor element 4, respectively. The terminal 841 is a second drive signal terminal for inputting a drive signal Vy to be applied to the sensor element 4, and the terminals 842 and 843 are second detection signal terminals for detecting detection signals output from the sensor element 4, that is, charges induced in the capacitances Cy1 and Cy2. Hereinafter, for convenience of explanation, the terminal 841 is also referred to as a "second drive signal terminal 841", and the terminals 842 and 843 are also referred to as "second detection signal terminals 842 and 843".

Similarly, the terminals 851, 852, and 853 are electrically coupled to the sensor element 5, respectively. The terminal 851 is a third drive signal terminal for inputting the drive signal Vz to be applied to the sensor element 5, and the terminals 852 and 853 are third detection signal terminals for detecting detection signals output from the sensor element 5, that is, charges induced in the capacitances Cz1 and Cz2. Hereinafter, for convenience of explanation, the terminal 851 is also referred to as a "third drive signal terminal 851", and the terminals 852 and 853 are also referred to as "third detection signal terminals 852 and 853".

As such, the terminals 831, 832, 833, 841, 842, 843, 851, 852, and 853 include two types of terminals, which are input and output terminals, that is, first, second, and third drive signal terminals 831, 841, and 851 that are input terminals for drive signals Vx, Vy, and Vz, and first, second, and third detection signal terminals 832, 833, 842, 843, 852, and 853 that are detection signal detection terminals. As illustrated in FIG. 1, the first, second, and third drive signal terminals 831, 841, and 851 that are input terminals are provided on the exposed portion 292, and the first, second, and third detection signal terminals 832, 833, 842, 843, 852, and 853 that are detection terminals are provided on the exposed portion 291. That is, the first, second, and third drive signal terminals 831, 841, and 851 that are input terminals and the first, second, and third detection signal terminals 832, 833, 842, 843, 852, and 853 that are detection terminals are provided at opposite sides with the lid 6 interposed between in plan view from the Z-axis direction.

By disposing the terminals 831, 832, 833, 841, 842, 843, 851, 852, and 853 in this way, the first, second, and third drive signal terminals 831, 841, 851 that are input terminals and the first, second, and third detection signal terminals 832, 833, 842, 843, 852, and 853 that are detection terminals can be disposed sufficiently apart from each other. For that reason, the detection signals detected from the first, second, and third detection signal terminals 832, 833, 842, 843, 852, and 853 are less likely to be mixed with the drive signals Vx, Vy, and Vz input from the first, second, and third drive signal terminals 831, 841, and 851 as noise, degradation of the S/N ratio of the detection signals can be suppressed, and reliability of the detection signal is increased. In particular, since the detected charge amount is very weak with respect to the drive signals Vx, Vy, and Vz, when the first, second, and third detection signal terminals 832, 833, 842, 843, 852, and 853, that are detection terminals, are sufficiently spaced apart from the first, second, and third drive signal terminals 831, 841, and 851, that are input terminals, the influence of electromagnetic noise generated from the drive signal can be suppressed, and the effect described above is exceptional. Accordingly, highly accurate detection is possible.

In the first embodiment, a group of terminals 831, 832, and 833 coupled to the sensor element 3 is disposed by being divided into the exposed portions 291 and 292, a group of terminals 841, 842 and 843 coupled to the sensor element 4 is disposed by being divided into the exposed portions 291 and 292, and a group of terminals 851, 852 and 853 coupled to the sensor element 5 is disposed by being divided into the exposed portions 291 and 292, but this is not limited thereto, and it suffices that at least one of the group of terminals 831, 832, and 833, the group of terminals 841, 842, and 843, and the group of terminals 851, 852, and 853 is disposed by being divided into the exposed portions 291 and 292.

As illustrated in FIG. 1, the first, second, and third drive signal terminals 831, 841 and 851 disposed in the exposed portion 291 are disposed side by side in a line in the Y-axis direction, respectively. With this configuration, the length of the exposed portion 291 in the X-axis direction can be shortened, and the inertial sensor 1 can be reduced in size. However, the disposition of the first, second, and third drive signal terminals 831, 841, and 851 is not particularly limited.

Similarly, the first, second, and third detection signal terminals 832, 833, 842, 843, 852, and 853 disposed in the exposed portion 292 are disposed side by side in a line in the Y-axis direction, respectively. With this configuration, the length of the exposed portion 292 in the X-axis direction can be shortened, and the inertial sensor 1 can be reduced in size. However, the disposition of the first, second, and third detection signal terminals 832, 833, 842, 843, 852, and 853 is not particularly limited.

In the group of wirings 731, 732, and 733 coupled to the sensor element 3, the wiring 732 coupled to the first detection signal terminal 832, that is, the first detection signal wiring, and the wiring 733 coupled to the first detection signal terminal 833, that is, the second detection signal wiring have the same length. With this configuration, the parasitic capacitances and parasitic resistances of the wirings 732 and 733 are equal to each other, and these parasitic capacitances and parasitic resistances can be effectively canceled by a differential operation. For that reason, the inertial sensor 1 can measure the acceleration Ax with higher accuracy.

In the group of wirings 741, 742, and 743 coupled to the sensor element 4, the wirings 742 and 743 for detection signal have the same length. With this configuration, the parasitic capacitances and parasitic resistances of the wirings 742 and 743 are equal to each other, and these parasitic capacitances and parasitic resistances can be effectively canceled by the differential operation. For that reason, the inertial sensor 1 can measure the acceleration Ay with higher accuracy.

In the group of wirings 751, 752, and 753 coupled to the sensor element 5, the wirings 752 and 753 for detection signal have the same length. With this configuration, the parasitic capacitances and parasitic resistances of the wirings 752 and 753 are equal to each other, and these parasitic capacitances and parasitic resistances can be effectively canceled by the differential operation. For that reason, the inertial sensor 1 can measure the acceleration Az with higher accuracy.

The fact that the wirings 732 and 733 have the same length means that a case where the lengths of the wirings 732 and 733 have an error that may occur in manufacturing, for example, an error within ±5% is included, in addition to a case where the lengths of the wirings 732 and 733 coincide with each other. The configuration of the wirings 732 and 733 is not limited thereto, and the wirings 732 and 733 may have different lengths, for example. The same applies to the group of wirings 741, 742, and 743 and the group of wirings 751, 752, and 753 described below.

The inertial sensor 1 has been described as above. The inertial sensor 1 includes the substrate 2, the sensor element 3 as the first inertial sensor element provided on the substrate 2, and the lid 6 bonded to the substrate 2 so as to cover the sensor element 3, the first drive signal terminal 831 that is provided outside the lid 6 and is for the drive signal Vx to be applied to the sensor element 3, and the first detection signal terminals 832 and 833 that are provided on the outside of the lid 6 and are for detection signals output by the sensor element 3. The first drive signal terminal 831 and the first detection signal terminals 832 and 833 are provided with the lid 6 interposed therebetween, in plan view of the substrate 2, that is, plan view from the Z-axis direction. In the first embodiment, the first drive signal terminal 831 is provided at the plus side in the X-axis direction with respect to the lid 6, and the first detection signal terminals 832 and 833 are provided at the minus side in the X-axis direction.

According to such a disposition, the first drive signal terminal 831 that is an input terminal and the first detection signal terminals 832 and 833 that are output terminals can be disposed sufficiently apart from each other. For that reason, it becomes difficult for the drive signal Vx input from the first drive signal terminal 831 to be mixed into the detection signals detected from the first detection signal terminals 832 and 833 as noise, and degradation of the S/N ratio of the detection signal can be suppressed. Accordingly, the acceleration in the X-axis direction can be measured with high accuracy. In particular, since the detection signal is a very weak signal with respect to the drive signal Vx, the effect described above is exceptional.

As described above, the inertial sensor 1 includes the sensor element 4 as the second inertial sensor element provided on the substrate 2, the second drive signal terminal 841 that is provided on the outside of the lid 6 and is for the drive signal Vy to be applied to the sensor element 4, and the second detection signal terminals 842 and 843 that are provided on the outside of the lid 6 and are for detection signals output by the sensor element 4. In plan view of the substrate 2, the second drive signal terminal 841 and the second detection signal terminals 842 and 843 are provided with the lid 6 interposed therebetween.

According to such a disposition, the second drive signal terminal 841 that is an input terminal and the second detection signal terminals 842 and 843 that are output terminals can be disposed sufficiently apart from each other. For that reason, it becomes difficult for the drive signal Vy input from the second drive signal terminal 841 to be mixed into the detection signals detected from the second detection signal terminals 842 and 843 as noise, and degradation of the S/N ratio of the detection signal can be suppressed. Accordingly, the acceleration in the Y-axis direction can be measured with high accuracy. In particular, since the detection signal is a very weak signal with respect to the drive signal Vy, the effect described above is exceptional.

Furthermore, the second drive signal terminal 841 is positioned at the same side as the first drive signal terminal 831 with respect to the lid 6, and the second detection signal terminals 842 and 843 are positioned at the same side as the first detection signal terminals 832 and 833 with respect to the lid 6. For that reason, it becomes difficult for the drive signals Vx and Vy input from the first and second drive signal terminals 831 and 841 to be mixed into the detection signals detected from the first and second detection signal terminals 832, 833, 842, and 843 as noise, and degradation of the S/N ratio of each detection signals can be suppressed. Accordingly, the acceleration in the X-axis direction and the Y-axis direction can be measured with high accuracy.

As described above, the inertial sensor 1 includes a pair of first detection signal terminals 832 and 833, the wiring 732 as a first detection signal wiring that electrically connects one first detection signal terminal 832 and the sensor element, and the wiring 733 as a second detection signal wiring that electrically connects the other first detection signal terminal 833 and the sensor element 3. The wiring 732 and the wiring 733 have the same length. With this configuration, the parasitic capacitances and parasitic resistances of the wirings 732 and 733 are equal to each other, and these parasitic capacitances and parasitic resistances can be effectively canceled by the differential operation. For that reason, the inertial sensor 1 can measure the acceleration Ax with higher accuracy.

As described above, each of the terminals 831, 832, and 833 is made of a metal film provided on the substrate 2. With this configuration, the configuration of the terminals 831, 832, and 833 is simplified.

Second Embodiment

Figure 7:
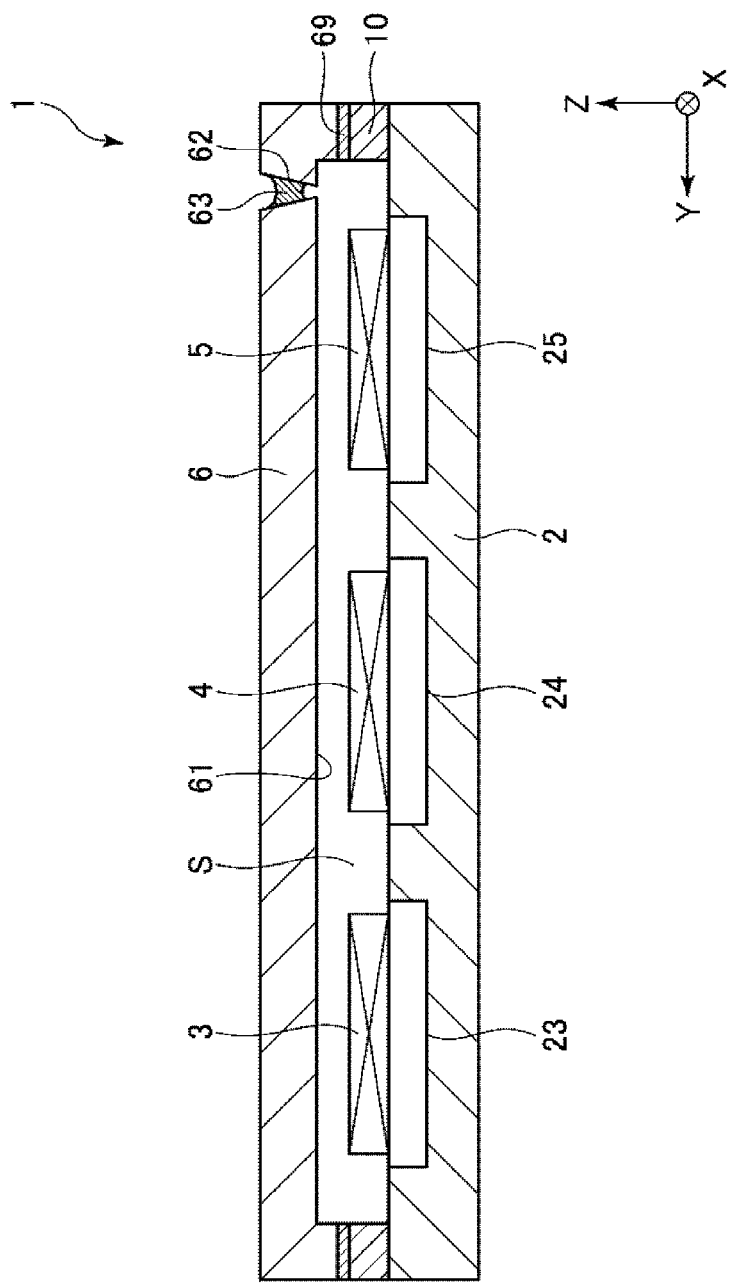
FIG. 7 is a cross-sectional view illustrating an inertial sensor of a second embodiment.
Figure 8:
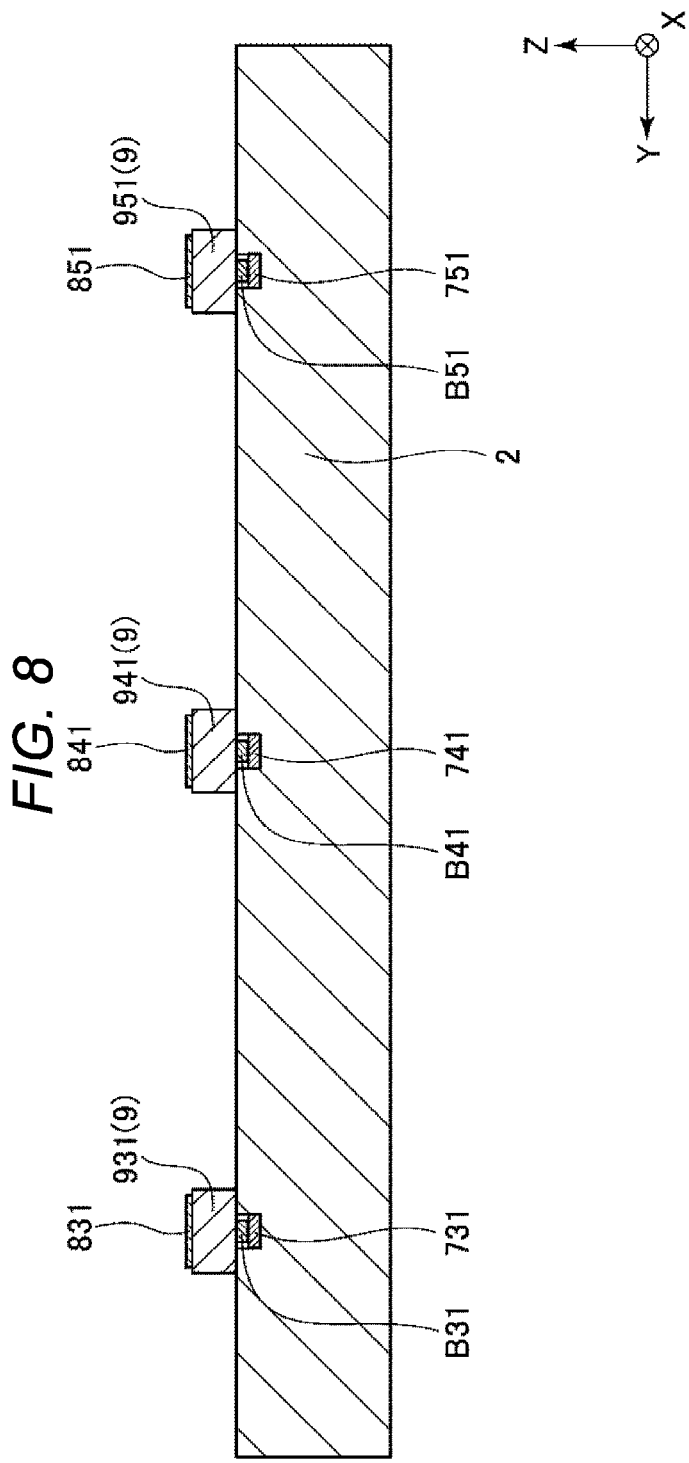
FIG. 8 is a cross-sectional view illustrating a mounting table disposed on a substrate.
Figure 9:
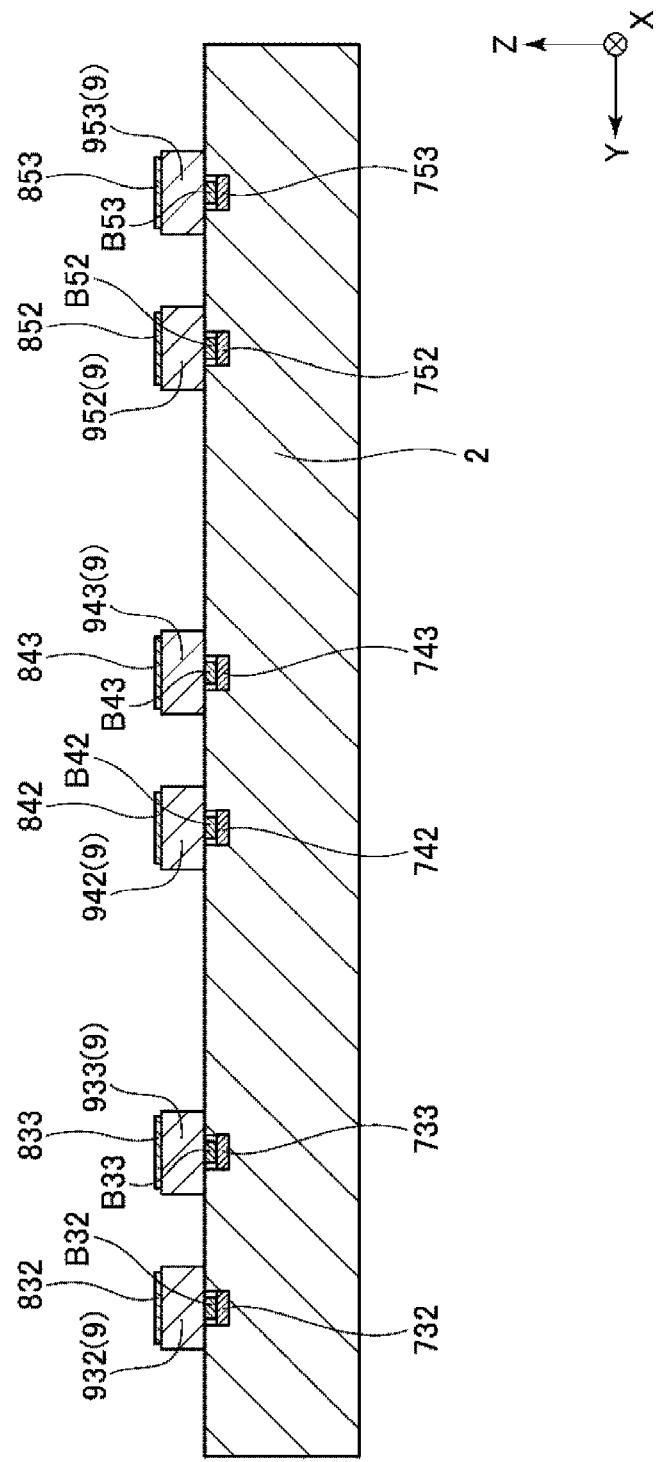
FIG. 9 is a cross-sectional view illustrating another mounting table provided on the substrate.

FIG. 7 is a cross-sectional view illustrating an inertial sensor of the second embodiment. FIGS. 8 and 9 are cross-sectional views each illustrating a mounting table disposed on a substrate. FIG. 8 corresponds to a cross-section taken along an imaginary line α1 in FIG. 1, and FIG. 9 corresponds to a cross-section taken along an imaginary line α2 in FIG. 1.

The second embodiment is the same as the first embodiment described above except that the bonding method of the substrate 2 and the lid 6 and the disposition of the terminals 831, 832, 833, 841, 842, 843, 851, 852, and 853 are different. In the following description, the second embodiment will be described with a focus on differences from the first embodiment described above, and description of similar matters will be omitted. In FIGS. 7 to 9, the same reference numerals are given to the same configurations as those in the first embodiment described above.

As illustrated in FIG. 7, the inertial sensor 1 includes an intermediate member 10 disposed between the substrate 2 and the lid 6. The intermediate member 10 has a frame shape surrounding the sensor elements 3, 4, and 5 in plan view from the Z-axis direction. As illustrated in FIGS. 8 and 9, the inertial sensor 1 includes a mounting table 9 disposed on the exposed portions 291 and 292 of the substrate 2. The intermediate member 10 and the mounting table 9 are made of the same material as the sensor elements 3, 4, and 5, respectively. For that reason, the intermediate member 10 and the mounting table 9 can be collectively formed with the sensor elements 3, 4, and 5. Specifically, the intermediate member 10 and the mounting table 9 can be collectively formed with the sensor elements 3, 4, and 5 by patterning a conductive silicon substrate that is anodically bonded to the substrate 2 by a Bosch process. For that reason, the inertial sensor 1 can be easily manufactured.

As illustrated in FIGS. 8 and 9, the mounting table 9 includes a mounting table 931 that is electrically coupled to the wiring 731 through a bump B31, a mounting table 932 that is electrically coupled to the wiring 732 through a bump B32, a mounting table 933 that is electrically coupled to the wiring 733 through a bump B33, a mounting table 941 that is electrically coupled to the wiring 741 through a bump B41, a mounting table 942 that is electrically coupled to the wiring 742 through a bump B42, a mounting table 943 that is electrically coupled to the wiring 743 through a bump B43, a mounting table 951 that is electrically coupled to the wiring 751 through a bump B51, a mounting table 952 that is electrically coupled to the wiring 752 through a bump B52, and a mounting table 953 that is electrically coupled to the wiring 753 through a bump B53.

Then, the terminal 831 is provided on the top surface of the mounting table 931, the terminal 832 is provided on the top surface of the mounting table 932, the terminal 833 is provided on the top surface of the mounting table 933, the terminal 841 is provided on the top surface of the mounting table 941, the terminal 842 is provided on the top surface of the mounting table 942, the terminal 843 is provided on the top surface of the mounting table 943, the terminal 851 is provided on the top surface of the mounting table 951, the terminal 852 is provided on the top surface of the mounting table 952, and the terminal 853 is provided on the top surface of the mounting table 953. For that reason, the terminal 831 is electrically coupled to the wiring 731 through the mounting table 931, the terminal 832 is electrically coupled to the wiring 732 through the mounting table 932, the terminal 833 is electrically coupled to the wiring 733 through the mounting table 933, the terminal 841 is electrically coupled to the wiring 741 through the mounting table 941, the terminal 842 is electrically coupled to the wiring 742 through the mounting table 942, the terminal 843 is electrically coupled to the wiring 743 through the mounting table 943, the terminal 851 is electrically coupled to the wiring 751 through the mounting table 951, the terminal 852 is electrically coupled to the wiring 752 through the mounting table 952, and the terminal 853 is electrically coupled to the wiring 753 through the mounting table 953.

As such, by disposing the terminals 831 to 843, and 851 to 853 on the mounting tables 931 to 933, 941 to 943, and 951 to 953, the terminals 831, 832, 833, 841, 842, 843, 851, 852, and 853 can be provided at positions protruding upward from the substrate 2. For that reason, for example, bonding wires can be easily coupled to the terminals 831 to 833, 841 to 843, and 851 to 853, and electrical connection between the inertial sensor 1 and an external device can be easily performed.

As illustrated in FIG. 7, a bonding member 69 is provided on the top surface of the intermediate member 10, and the intermediate member 10 and the lid 6 are bonded by the bonding member 69. In particular, in the second embodiment, the bonding member 69 is made of a metal material, and the bonding member 69 and the lid 6 are bonded by being thermocompression-bonded with each other. However, the bonding method of the bonding member 69 or the intermediate member 10 and the lid 6 is not particularly limited.

In the second embodiment, the terminals 831 to 833, 841 to 843, and 851 to 853 and the bonding member 69 are made of the same material. With this configuration, the terminals 831 to 833, 841 to 843, and 851 to 853 and the bonding member 69 can be collectively formed, and the terminals 831 to 833, 841 to 843, and 851 to 853 and the bonding member 69 can be easily formed. Specifically, by depositing a metal film on the upper surface of the conductive silicon substrate that is a base material of the sensor elements 3, 4, and 5, the intermediate member 10, and the mounting table 9, and patterning this metal film, the terminals 831 to 833, 841 to 843, and 851 to 853 and the bonding member 69 can be collectively formed.

The constituent materials of the terminals 831 to 833, 841 to 843, and 851 to 853 and the bonding member 69 are not particularly limited, but, for example, an aluminum (Al)/germanium (Ge)-based alloy can be used. Since this material is excellent in adhesiveness, airtightness of the accommodation space S can be more reliably ensured.

As described above, in the inertial sensor 1 of the second embodiment, the plurality of terminals 831 to 833, 841 to 843, and 851 to 853 are provided on the substrate 2 and provided on the mounting table 9 made of the same material as the sensor elements 3, 4, and 5. With this configuration, the terminals 831 to 833, 841 to 843, and 851 to 853 can be disposed at positions protruding upward from the substrate 2. For that reason, for example, the bonding wires can be easily coupled to the terminals 831 to 833, 841 to 843, and 851 to 853, and the inertial sensor 1 and the external device can be easily electrically coupled. By configuring the mounting table 9 with the same material as the sensor elements 3, 4, and 5, the mounting table 9 can be formed together with the sensor elements 3, 4, and 5, and thus the inertial sensor 1 can be easily manufactured.

As described above, the inertial sensor 1 includes the bonding member 69 that is provided between the substrate 2 and the lid 6 and bonds the substrate 2 and the lid 6. The bonding member 69 contains the same material as the plurality of terminals 831 to 833, 841 to 843, and 851 to 853. With this configuration, the bonding member 69 and the terminals 831 to 833, 841 to 843, and 851 to 853 can be collectively formed, and thus the inertial sensor 1 can be easily manufactured.

According to the second embodiment as described above, the same effects as those of the first embodiment described above can be exhibited.

Third Embodiment

Figure 10:
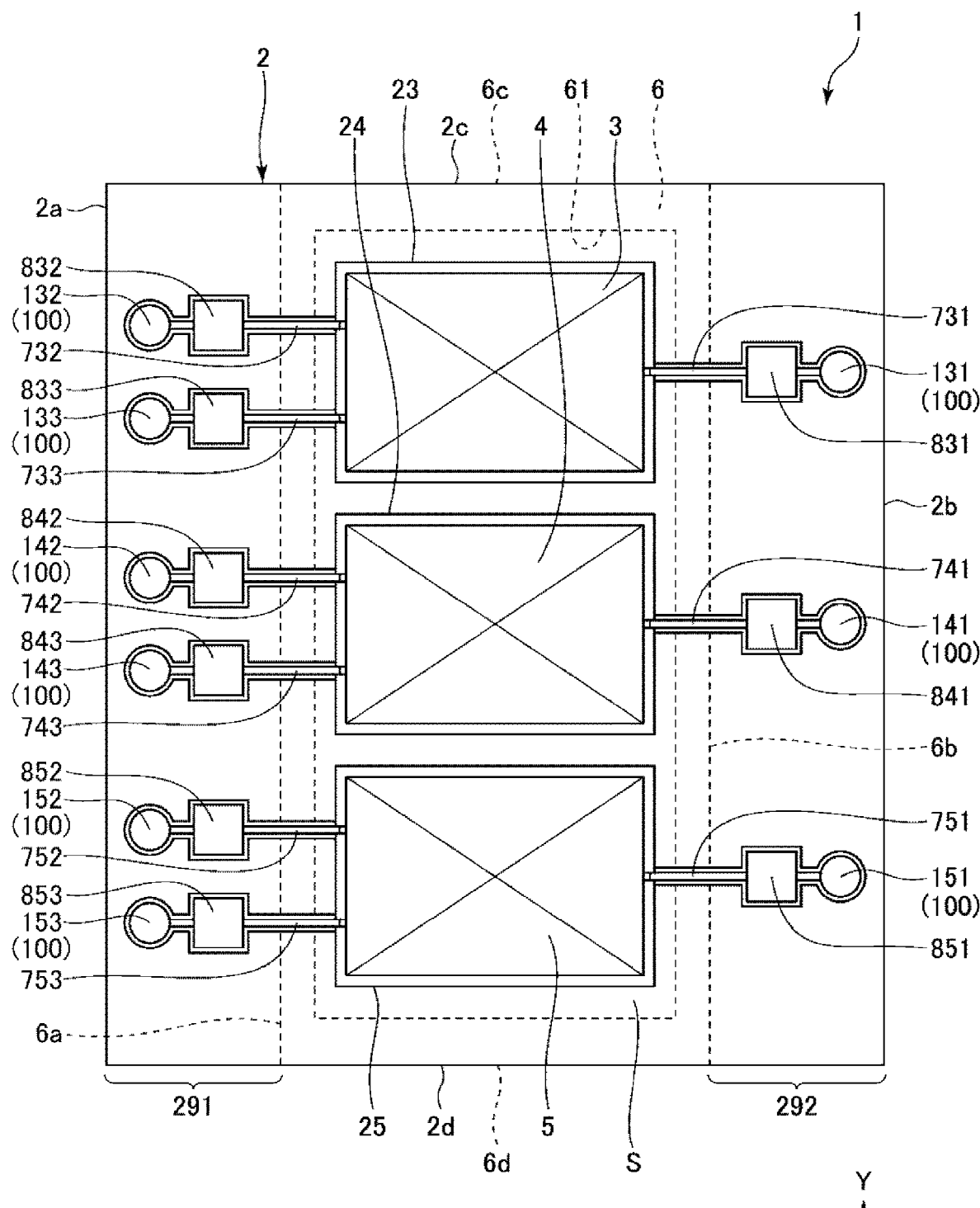
FIG. 10 is a partially enlarged plan view illustrating an inertial sensor according to a third embodiment.

FIG. 10 is a partially enlarged plan view illustrating an inertial sensor of a third embodiment.

The third embodiment is the same as the first embodiment described above except that an inspection terminal 100 electrically coupled to the terminals 831 to 833, 841 to 843, and 851 to 853 is included. In the following description, the third embodiment will be described with a focus on differences from the first and second embodiments, and description of similar matters will be omitted. In FIG. 10, the same reference numerals are given to the same configurations as those in the first and second embodiments described above.

As illustrated in FIG. 10, the inertial sensor 1 includes an inspection terminal 100 provided on the exposed portions 291 and 292 of the substrate 2 and is electrically coupled to the terminals 831 to 833, 841 to 843, and 851 to 853.

The inspection terminal 100 includes an inspection terminal 131 that is disposed side by side with the terminal 831 and is electrically coupled to the terminal 831, an inspection terminal 132 that is disposed side by side with the terminal 832 and is electrically coupled to the terminal 832, an inspection terminal 133 that is disposed side by side with the terminal 833 and is electrically coupled to the terminal 833, an inspection terminal 141 that is disposed side by side with the terminal 841 and is electrically coupled to the terminal 841, an inspection terminal 142 that is disposed side by side with the terminal 842 and is electrically coupled to the terminal 842, an inspection terminal 143 that is disposed side by side with the terminal 843 and is electrically coupled to the terminal 843, an inspection terminal 151 that is disposed side by side with the terminal 851 and is electrically coupled to the terminal 851, an inspection terminal 152 that is disposed side by side with the terminal 852 and is electrically coupled to the terminal 852, and an inspection terminal 153 that is disposed side by side with the terminal 853 and is electrically coupled to the terminal 853.

By providing such inspection terminals 131, 132, 133, 141, 142, 143, 151, 152, and 153, for example, the inertial sensor 1 can be inspected by pressing an inspection probe against the inspection terminals 131, 132, 133, 141, 142, 143, 151, 152, and 153, and thus the terminals 831, 832, 833, 841, 842, 843, 851, 852, and 853 are not damaged during inspection. For that reason, the bonding wire and each terminal can be coupled well, and the inertial sensor 1 with high reliability is obtained.

In the third embodiment, the inspection terminals 131, 132, 133, 141, 142, 143, 151, 152, and 153 have a shape in plan view different from that of the terminals 831, 832, 833, 841, 842, 843, 851, 852, and 853, respectively. Each of the inspection terminals 131, 132, 133, 141, 142, 143, 151, 152, and 153 has a circular shape in plan view, and the shape in plan view is rotationally symmetric. As such, by making the shape of the inspection terminals 131, 132, 133, 141, 142, 143, 151, 152, and 153 in plan view different from that of the terminals 831, 832, 833, 841, 842, 843, 851, 852, and 853 and setting the shape of the inspection terminals 131, 132, 133, 141, 142, 143, 151, 152, and 153 in plan view to be rotationally symmetric, the inspection terminals 131, 132, 133, 141, 142, 143, 151, 152, and 153 can be easily recognized by an image recognition technique when the inertial sensor 1 is inspected, for example.

However, the shape of the inspection terminals 131, 132, 133, 141, 142, 143, 151, 152, and 153 is not particularly limited, and the shape of the inspection terminals 131, 132, 133, 141, 142, 143, 151, 152, and 153 may be the same shape as the terminal 831, 832, 833, 841, 842, 843, 851, 852, and 853 or may be a shape other than the rotationally symmetric shape.

As described above, the inertial sensor 1 of the third embodiment includes a plurality of inspection terminals 131, 132, 133, 141, 142, 143, 151, 152, and 153 that are coupled to the plurality of terminals 831, 832, 833, 841, 842, 843, 851, 852, and 853 and have a shape in plan view different from that of the plurality of terminals 831, 832, 833, 841, 842, 843, 851, 852, and 853. With this configuration, the inspection of the inertial sensor 1 can be performed using the inspection terminals 131, 132, 133, 141, 142, 143, 151, 152, and 153, and thus the terminals 831, 832, 833, 841, 842, 843, 851, 852, and 853 will not be damaged during inspection. For that reason, the inertial sensor 1 with high reliability is obtained. Also, by making the shapes of the inspection terminals and terminals different from each other, the inspection terminals 131, 132, 133, 141, 142, 143, 151, 152, and 153 and the terminals 831, 832, 833, 841, 842, 843, 851, 852, and 853 can be easily identified.

As described above, the shapes of the plurality of inspection terminals 131, 132, 133, 141, 142, 143, 151, 152, and 153 in plan view are rotationally symmetric. With this configuration, the inspection terminals 131, 132, 133, 141, 142, 143, 151, 152, and 153 can be easily recognized by an image recognition technique, and the inertial sensor 1 can be inspected more smoothly.

As described above, the input terminals 831, 841, and 851 and the detection terminals 832, 833, 842, 843, 852, and 853 are provided at opposite sides with the lid 6 interposed therebetween, but the inspection terminals 100 coupled to these input terminals and detection terminals are also disposed in the same manner. With this configuration, the same effect as that of the first embodiment described above can be exhibited not only during normal operation of the inertial sensor 1 but also during inspection using the inspection terminal 100.

Fourth Embodiment

Figure 11:
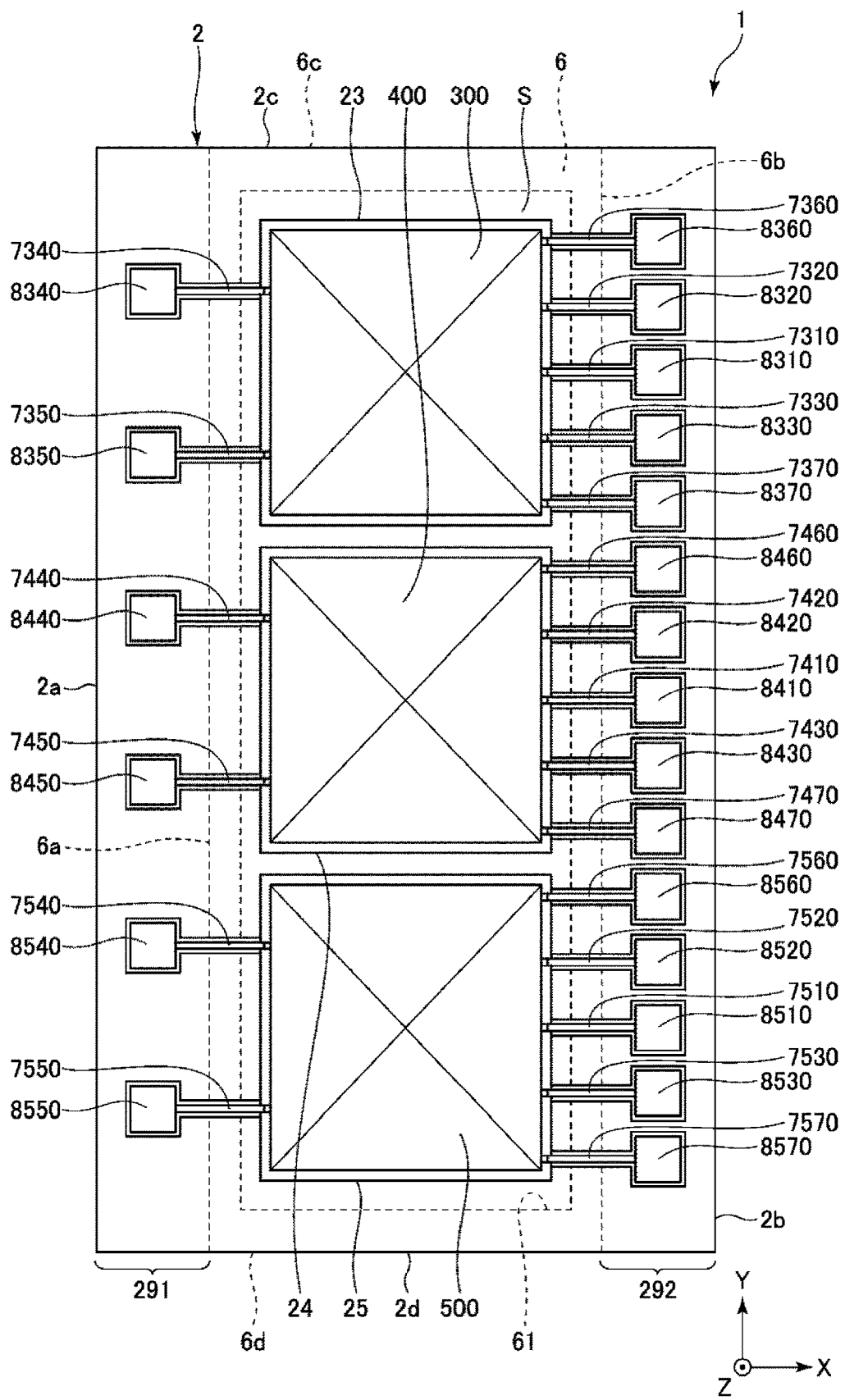
FIG. 11 is a plan view illustrating an inertial sensor according to a fourth embodiment.
Figure 13:
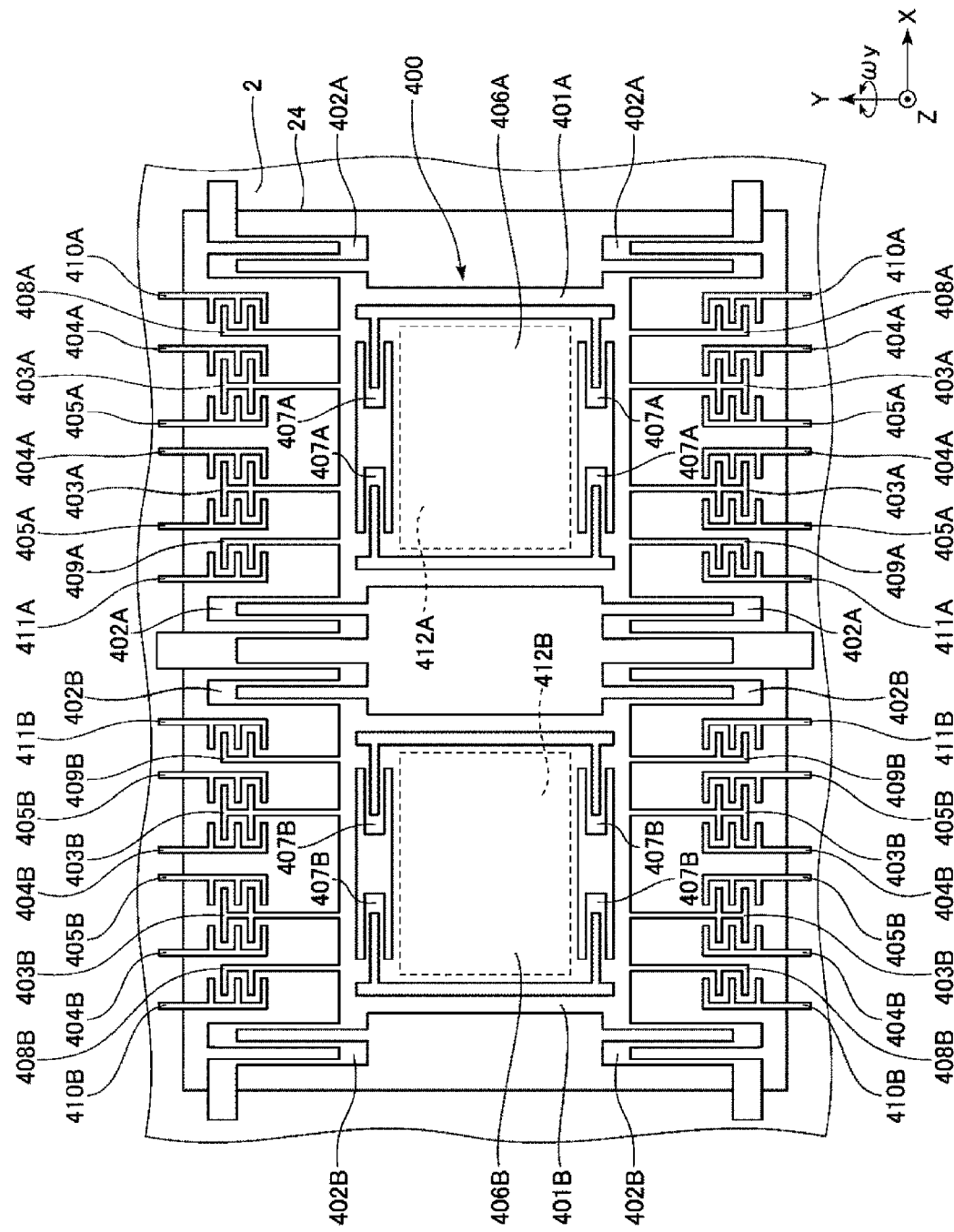
FIG. 13 is a plan view illustrating an example of a sensor element that measures an angular velocity around the Y-axis.
Figure 14:
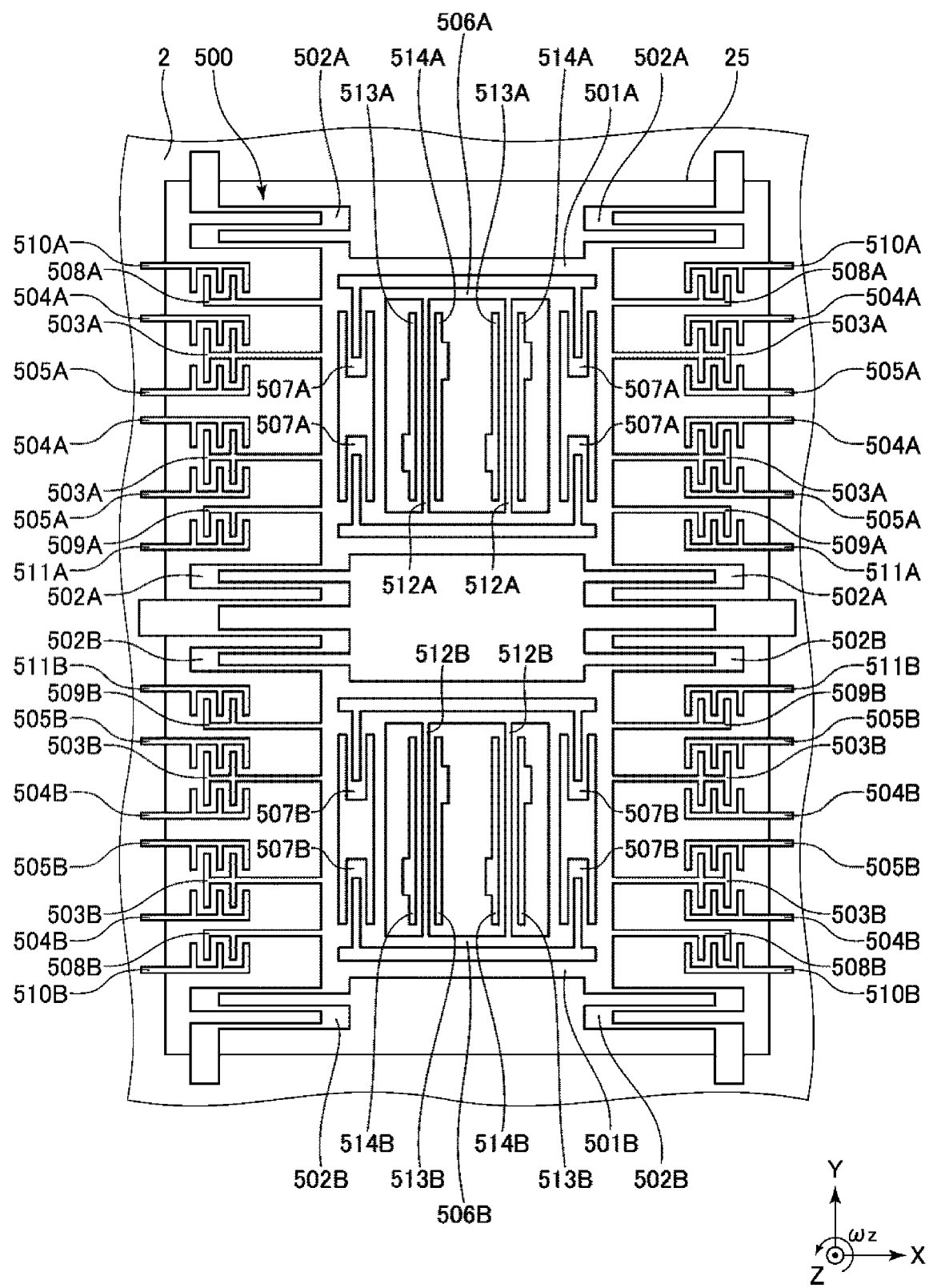
FIG. 14 is a plan view illustrating an example of a sensor element that measures an angular velocity around the Z-axis.
Figure 15:
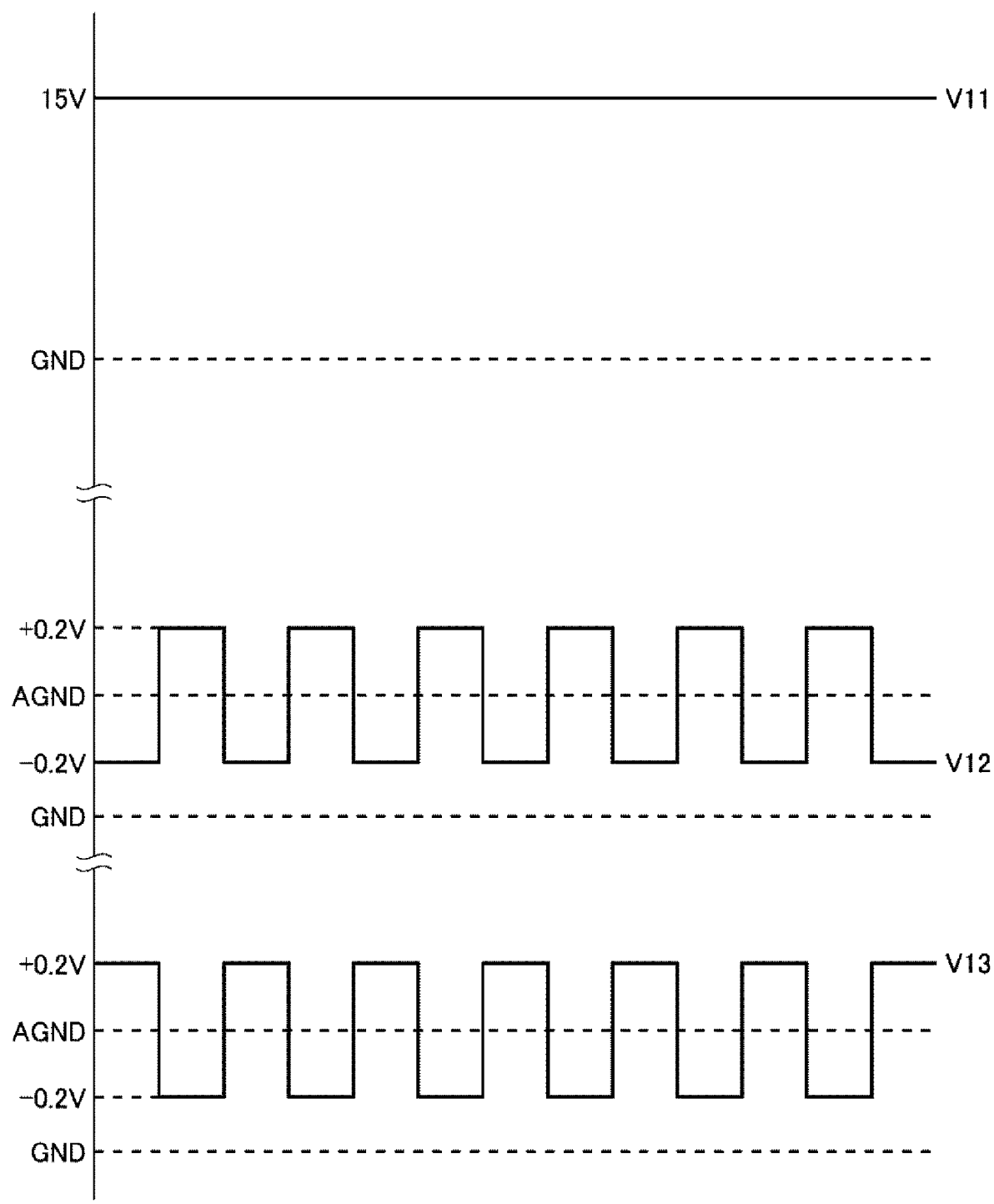
FIG. 15 is a graph illustrating an example of a voltage applied to the sensor element.

FIG. 11 is a plan view illustrating an inertial sensor of the fourth embodiment. FIG. 12 is a plan view illustrating an example of a sensor element that measures an angular velocity around the X-axis. FIG. 13 is a plan view illustrating an example of a sensor element that measures an angular velocity around the Y-axis. FIG. 14 is a plan view illustrating an example of a sensor element that measures an angular velocity around the Z-axis. FIG. 15 is a graph illustrating a voltage applied to the sensor element. In FIG. 11, for convenience of explanation, the sensor elements 300, 400, and 500 are illustrated in a simplified manner.

The fourth embodiment is the same as the first embodiment described above except that sensor elements 300, 400, and 500 are used instead of the sensor elements 3, 4, and 5. In the following description, the fourth embodiment will be described with a focus on differences from the first to third embodiments described above, and description of similar matters will be omitted. In FIGS. 11 to 15, the same reference numerals are given to the same configurations as those in the first to third embodiments described above.

The inertial sensor 1 illustrated in FIG. 11 is an angular velocity sensor that can independently measure angular velocities around the X-, Y-, and Z-axes that are orthogonal to each other. Such an inertial sensor 1 includes the substrate 2, three sensor elements 300, 400, and 500 disposed on the substrate 2, and the lid 6 that accommodates the sensor elements 300, 400, and 500 and is bonded to the substrate 2. Of the three sensor elements 300, 400, and 500, the sensor element 300 (first inertial sensor element) measures an angular velocity ox around the X-axis, the sensor element 400 (second inertial sensor element) measures the angular velocity coy around the Y-axis, and the sensor element 500 (third inertial sensor element) measures the angular velocity oz around the Z-axis.

The accommodation space S formed by the substrate 2 and the lid 6 may be in a reduced pressure state, and particularly may be in a vacuum state. By setting the accommodation space S in a decompressed state, viscous resistance is reduced and the sensor elements 300, 400, and 500 can be vibrated effectively. For that reason, detection accuracy of the inertial sensor 1 is improved. A highly airtight accommodation space S can be formed by directly bonding the lid 6 to the substrate 2.

In addition, the substrate 2 has a groove that open to its upper surface, and a plurality of wirings 7310, 7320, 7330, 7340, 7350, 7360, 7370, 7410, 7420, 7430, 7440, 7450, 7460, 7470, 7510, 7520, 7530, 7540, 7550, 7560, and 7570 and terminals 8310, 8320, 8330, 8340, 8350, 8360, 8370, 8410, 8420, 8430, 8440, 8450, 8460, 8470, 8510, 8520, 8530, 8540, 8550, 8560, and 8570 are disposed in the groove.

The wirings 7310 to 7370, 7410 to 7470, 7510 to 7570 are disposed inside and outside of the accommodation space S, and, among these wirings, each of the wirings 7310 to 7370 is electrically coupled to the sensor element 300, each of the wirings 7410 to 7470 is electrically coupled to the sensor element 400, and each of the wirings 7510 to 7570 is electrically coupled to the sensor element 500. The terminals 8310 to 8370, 8410 to 8470, and 8510 to 8570 are positioned outside the lid 6 and are provided by being divided into the exposed portions 291 and 292. The terminals 8310 to 8370 are electrically coupled to the wirings 7310 to 7370, the terminals 8410 to 8470 are electrically coupled to the wirings 7410 to 7470, and the terminals 8510 to 8570 are electrically coupled to the wirings 7510 to 7570.

Similar to the sensor elements 3, 4, and 5 of the first embodiment described above, the sensor elements 300, 400, and 500 can be collectively formed by anodically bonding a silicon substrate doped with impurities such as phosphorus (P), boron (B), and arsenic (As) to the upper surface of the substrate 2 and patterning the silicon substrate by a Bosch process that is a deep groove etching technique. However, the method of forming the sensor elements 300, 400, 500 is not limited thereto.

The sensor element 300 can measure the angular velocity ωx around the X-axis. As illustrated in FIG. 12, such a sensor element 300 includes, for example, frame-like drive movable bodies 301A and 301B, drive springs 302A and 302B for supporting the drive movable bodies 301A and 301B so as to vibrate in the Y-axis direction, movable drive electrodes 303A and 303B coupled to the drive movable bodies 301A and 301B, first and second fixed drive electrodes 304A and 305A disposed with the movable drive electrode 303A interposed therebetween, first and second fixed drive electrodes 304B and 305B disposed with the movable drive electrode 303B interposed therebetween, detection movable bodies 306A and 306B disposed inside the drive movable bodies 301A and 301B, detection springs 307A and 307B coupling the detection movable bodies 306A and 306B and the drive movable bodies 301A and 301B, first movable monitor electrodes 308A and 308B and second movable monitor electrodes 309A and 309B coupled to the drive movable bodies 301A and 301B, first fixed monitor electrodes 310A and 310B disposed to face the first movable monitor electrodes 308A and 308B, and second fixed monitor electrodes 311A and 311B disposed to face the second movable monitor electrodes 309A and 309B. Further, fixed detection electrodes 312A and 312B are disposed on the bottom surface of the concave portion 23 so as to face the drive movable bodies 301A and 301B.

Although not illustrated, the detection movable bodies 306A and 306B are electrically coupled to the wiring 7310, the first fixed drive electrodes 304A and 304B are electrically coupled to the wiring 7320, the second fixed drive electrodes 305A and 305B are electrically coupled to the wiring 7330, the fixed detection electrode 312A is electrically coupled to the wiring 7340, the fixed detection electrode 312B is electrically coupled to the wiring 7350, the first fixed monitor electrodes 310A and 310B are electrically coupled to the wiring 7360, and the second fixed monitor electrodes 311A and 311B are electrically coupled to the wiring 7370.

Then, for example, a drive signal V11 illustrated in FIG. 15 is applied to the detection movable bodies 306A and 306B via the terminal 8310. A drive signal V12 illustrated in FIG. 15 is applied to the first fixed drive electrodes 304A and 304B via the terminal 8320, and a drive signal V13 illustrated in FIG. 15 is applied to the second fixed drive electrodes 305A and 305B via the terminal 8330. The drive signal V11 is, for example, 15 V, the drive signal V12 is, for example, a voltage having amplitude of ±0.2 V with respect to the analog ground AGND, and the drive signal V13 is, for example, a voltage, whose phase is opposite to the drive signal V12, having amplitude of ±0.2 V with respect to the analog ground AGND. With this configuration, the drive movable bodies 301A and 301B are driven to vibrate in the Y-axis direction in opposite phases. During this drive vibration, a first pickup signal corresponding to the driving vibration is detected from the terminal 8360, and a second pickup signal corresponding to the drive vibration is detected from the terminal 8370. By feeding the first and second pickup signals back to the drive signals, that is, the drive signals V12 and V13, the drive vibration of the drive movable bodies 301A and 301B is stabilized.

On the other hand, the fixed detection electrodes 312A and 312B are coupled to the charge amplifier through terminals 8340 and 8350. For that reason, the capacitance Cx1 is formed between the detection movable body 306A and the fixed detection electrode 312A, and the capacitance Cx2 is formed between the detection movable body 306B and the fixed detection electrode 312B. When the angular velocity ωx around the X-axis is applied to the sensor element 300 in a state where the drive movable bodies 301A and 301B are in drive vibration, the detection movable bodies 306A and 306B are displaced in the Z-axis direction in opposite phases with each other by the Coriolis force, and accordingly the capacitances Cx1 and Cx2 change in opposite phases. For that reason, the amount of charge induced between the detection movable body 306A and the fixed detection electrode 312A and the amount of charge induced between the detection movable body 306B and the fixed detection electrode 312B also change based on the changes in the capacitances Cx1 and Cx2. When a difference occurs between the charge amount induced between the detection movable body 306A and the fixed detection electrode 312A and the charge amount induced between the detection movable body 306B and the fixed detection electrode 312B, the difference is output as the voltage value of the charge amplifier. In this way, the angular velocity ωx received by the sensor element 300 can be obtained.

The sensor element 400 can measure the angular velocity ωy around the Y-axis. Such a sensor element 400 is not particularly limited, but, for example, as illustrated in FIG. 13, can be configured by rotating the sensor element 300 described above by 90 degrees around the Z-axis.

That is, as illustrated in FIG. 13, such a sensor element 400 includes, for example, frame-like drive movable bodies 401A and 401B, drive springs 402A and 402B for supporting the drive movable bodies 401A and 401B so as to vibrate in the Y-axis direction, movable drive electrodes 403A and 403B coupled to the drive movable bodies 401A and 401B, first and second fixed drive electrodes 404A and 405A disposed with the movable drive electrode 403A interposed therebetween, first and second fixed drive electrodes 404B and 405B disposed with the movable drive electrode 403B interposed therebetween, detection movable bodies 406A and 406B disposed inside the drive movable bodies 401A and 401B, detection springs 407A and 407B coupling the detection movable bodies 406A and 406B and the drive movable bodies 401A and 401B, first movable monitor electrodes 408A and 408B and second movable monitor electrodes 409A and 409B coupled to the drive movable bodies 401A and 401B, first fixed monitor electrodes 410A and 410B disposed to face the first movable monitor electrodes 408A and 408B, and second fixed monitor electrodes 411A and 411B disposed to face the second movable monitor electrodes 409A and 409B. Further, fixed detection electrodes 412A and 412B are disposed on the bottom surface of the concave portion 24 so as to face the drive movable bodies 401A and 401B.

Although not illustrated, the detection movable bodies 406A and 406B are electrically coupled to the wiring 7410, the first fixed drive electrodes 404A and 404B are electrically coupled to the wiring 7420, and the second fixed drive electrodes 405A and 405B are electrically coupled to the wiring 7430, the fixed detection electrode 412A is electrically coupled to the wiring 7440, the fixed detection electrode 412B is electrically coupled to the wiring 7450, the first fixed monitor electrodes 410A and 410B are coupled to the wiring 7460, and the second fixed monitor electrodes 411A and 411B are electrically coupled to the wiring 7470.

Then, for example, the drive signal V11 illustrated in FIG. 15 is applied to the detection movable bodies 406A and 406B via the terminal 8410. The drive signal V12 illustrated in FIG. 15 is applied to the first fixed drive electrodes 404A and 404B via the terminal 8420, and the drive signal V13 illustrated in FIG. 15 is applied to the second fixed drive electrodes 405A and 405B via the terminal 8430. The drive signal V11 is, for example, 15 V, the drive signal V12 is, for example, a voltage having amplitude of ±0.2 V with respect to the analog ground AGND, and the drive signal V13 is, for example, a voltage, whose phase is opposite to the drive signal V12, having amplitude of ±0.2 V with respect to the analog ground AGND. With this configuration, the drive movable bodies 401A and 401B are driven to vibrate in the X-axis direction in opposite phases. During this drive vibration, a first pickup signal corresponding to the driving vibration is detected from the terminal 8460, and a second pickup signal corresponding to the drive vibration is detected from the terminal 8470. By feeding the first and second pickup signals back to the drive signals, that is, the drive signals V12 and V13, the drive vibration of the drive movable bodies 401A and 401B is stabilized.

On the other hand, the fixed detection electrodes 412A and 412B are coupled to the charge amplifier through terminals 8440 and 8450. For that reason, the capacitance Cy1 is formed between the detection movable body 406A and the fixed detection electrode 412A, and the capacitance Cy2 is formed between the detection movable body 406B and the fixed detection electrode 412B. When the angular velocity ωy around the Y-axis is applied to the sensor element 400 in a state where the drive movable bodies 401A and 401B are in drive vibration, the detection movable bodies 406A and 406B are displaced in the Z-axis direction in opposite phases with each other by the Coriolis force, and accordingly the capacitances Cy1 and Cy2 change in opposite phases. For that reason, the amount of charge induced between the detection movable body 406A and the fixed detection electrode 412A and the amount of charge induced between the detection movable body 406B and the fixed detection electrode 412B also change based on the changes in the capacitances Cy1 and Cy2. When a difference occurs between the charge amount induced between the detection movable body 406A and the fixed detection electrode 412A and the charge amount induced between the detection movable body 406B and the fixed detection electrode 412B, the difference is output as the voltage value of the charge amplifier. In this way, the angular velocity ωy received by the sensor element 400 can be obtained.

The sensor element 500 can measure the angular velocity ωz around the Z-axis. Such a sensor element 500 is not particularly limited, but, as illustrated in FIG. 14, includes, for example, frame-like drive movable bodies 501A and 501B, drive springs 502A and 502B for supporting the drive movable bodies 501A and 501B so as to vibrate in the Y-axis direction, movable drive electrodes 503A and 503B coupled to the drive movable bodies 501A and 501B, first and second fixed drive electrodes 504A and 505A disposed with the movable drive electrode 503A interposed therebetween, first and second fixed drive electrodes 504B and 505B disposed with the movable drive electrode 503B interposed therebetween, detection movable bodies 506A and 506B disposed inside the drive movable bodies 501A and 501B, detection springs 507A and 507B coupling the detection movable bodies 506A and 506B and the drive movable bodies 501A and 501B, first movable monitor electrodes 508A and 508B and second movable monitor electrodes 509A and 509B coupled to the drive movable bodies 501A and 501B, first fixed monitor electrodes 510A and 510B disposed to face the first movable monitor electrodes 508A and 508B, second fixed monitor electrodes 511A and 511B disposed to face the second movable monitor electrodes 509A and 509B, movable detection electrodes 512A and 512B supported by detection movable bodies 506A and 506B, the first and second fixed detection electrodes 513A and 514A disposed with the movable detection electrode 512A interposed therebetween, and the first and second fixed detection electrodes 513B and 514B disposed with the movable detection electrode 512B interposed therebetween.

Although not illustrated, the detection movable bodies 506A and 506B are electrically coupled to the wiring 7510, the first fixed drive electrodes 504A and 504B are electrically coupled to the wiring 7520, and the second fixed drive electrodes 505A and 505B are electrically coupled to the wiring 7530, the first fixed detection electrodes 513A and 513B are electrically coupled to the wiring 7540, the second fixed detection electrodes 514A and 514B are electrically coupled to the wiring 7550, the first fixed monitor electrodes 510A and 510B are electrically coupled to the wiring 7560, and the second fixed monitor electrodes 511A and 511B are electrically coupled to the wiring 7570.

Then, for example, the drive signal V11 illustrated in FIG. 15 is applied to the detection movable bodies 506A and 506B via the terminal 8510. The drive signal V12 illustrated in FIG. 15 is applied to the first fixed drive electrodes 504A and 504B via a terminal 8520, and the drive signal V13 illustrated in FIG. 15 is applied to the second fixed drive electrodes 505A and 505B via the terminal 8530. The drive signal V11 is, for example, 15 V, the drive signal V12 is, for example, a voltage having amplitude of ±0.2 V with respect to the analog ground AGND, and the drive signal V13 is, for example, a voltage, whose phase is opposite to the drive signal V12, having amplitude of ±0.2 V with respect to the analog ground AGND. With this configuration, the drive movable bodies 501A and 501B are driven to vibrate in the Y-axis direction in opposite phases. During this drive vibration, a first pickup signal corresponding to the driving vibration is detected from the terminal 8560, and a second pickup signal corresponding to the drive vibration is detected from the terminal 8570. By feeding the first and second pickup signals back to the drive signals, that is, the drive signals V12 and V13, the drive vibration of the drive movable bodies 501A and 501B is stabilized.

On the other hand, the first fixed detection electrodes 513A and 513B are coupled to the charge amplifier through the terminal 8540, and the second fixed detection electrodes 514A and 514B are coupled to the charge amplifier through the terminal 8550. For that reason, the capacitance Cz1 is formed between the movable detection electrodes 512A and 512B and the first fixed detection electrodes 513A and 513B, and the capacitance Cz2 is formed between the movable detection electrodes 512A and 512B and the second fixed detection electrodes 514A and 514B. When the angular velocity ωz around the Z-axis is applied to the sensor element 500 in a state where the drive movable bodies 501A and 501B are in drive vibration, the detection movable bodies 506A and 506B are displaced in the X-axis direction in opposite phases with each other by the Coriolis force, and accordingly the capacitances Cz1 and Cz2 change in opposite phases. For that reason, the amount of charge induced between the movable detection electrodes 512A and 512B and the first fixed detection electrodes 513A and 513B, and the amount of charge induced between the movable detection electrodes 512A and 512B and the second fixed detection electrodes 514A and 514B also change based on the changes in the capacitances Cz1 and Cz2. When a difference occurs between the charge amount induced between the movable detection electrodes 512A and 512B and the first fixed detection electrodes 513A and 513B and the charge amount induced between the movable detection electrodes 512A and 512B and the second fixed detection electrodes 514A and 514B, the difference is output as the voltage value of the charge amplifier. In this way, the angular velocity ωz received by the sensor element 500 can be obtained.

The sensor elements 300, 400, and 500 have been described as above. The configurations of the sensor elements 300, 400, and 500 are not particularly limited as long as the angular velocities ωx, ωy, and ωz can be detected.

Next, the disposition of the terminals 8310 to 8370, 8410 to 8470, and 8510 to 8570 will be described in more detail.

Each of the terminals 8310 to 8370 is electrically coupled to the sensor element 300. The terminals 8310, 8320, and 8330 are first drive signal terminals for inputting the drive signals V11 to V13 to the sensor element 300, the terminals 8340 and 8350 are first detection signal terminals for detecting the detection signals detected by the sensor element 300, that is, signals corresponding to the capacitances Cx1 and Cx2, and the terminals 8360 and 8370 are first pickup signal terminals for detecting the first and second pickup signals detected by the sensor element 300. Hereinafter, for convenience of explanation, the terminals 8310, 8320, and 8330 are also referred to as "first drive signal terminals 8310, 8320, and 8330", the terminals 8340 and 8350 are also referred to as "first detection signal terminals 8340 and 8350", and the terminals 8360 and 8370 are also referred to as "first pickup signal terminals 8360 and 8370".

Similarly, each of the terminals 8410 to 8470 is electrically coupled to the sensor element 400. The terminals 8410, 8420, and 8430 are second drive signal terminals for inputting the drive signals V11 to V13 to the sensor element 400, the terminals 8440 and 8450 are second detection signal terminals for detecting the detection signals detected by the sensor element 400, that is, signals corresponding to the capacitances Cy1 and Cy2, and the terminals 8460 and 8470 are second pickup signal terminals for detecting the first and second pickup signals detected by the sensor element 400. Hereinafter, for convenience of explanation, the terminals 8410, 8420, and 8430 are also referred to as "second drive signal terminals 8410, 8420, and 8430", the terminals 8440 and 8450 are also referred to as "second detection signal terminals 8440 and 8450", and the terminals 8460 and 8470 are also referred to as "second pickup signal terminals 8460 and 8470".

Similarly, each of the terminals 8510 to 8570 is electrically coupled to the sensor element 500. The terminals 8510, 8520, and 8530 are third drive signal terminals for inputting the drive signals V11 to V13 to the sensor element 500, the terminals 8540 and 8550 are third detection signal terminals for detecting the detection signals detected by the sensor element 500, that is, signals corresponding to the capacitances Cz1 and Cz2, and the terminals 8560 and 8570 are third pickup signal terminals for detecting the first and second pickup signals detected by the sensor element 500. Hereinafter, for convenience of explanation, the terminals 8510, 8520, and 8530 are also referred to as "third drive signal terminals 8510, 8520, and 8530", the terminals 8540 and 8550 are also referred to as "third detection signal terminals 8540 and 8550", and the terminals 8560 and 8570 are also referred to as "third pickup signal terminals 8560 and 8570".

As such, the terminals 8310 to 8370, 8410 to 8470, and 8510 to 8570 include the first, second, and third drive signal terminals 8310 to 8330, 8410 to 8430, and 8510 to 8530 that are input terminals for the drive signals V11, V12, and V13, the first, second, and third detection signal terminals 8340, 8350, 8440, 8450, 8540, and 8550 that are detection terminals for the detection signals, and the first, second, and third pickup signal terminals 8360, 8370, 8460, 8470, 8560, and 8570 that are detection terminals for the first and second pickup signals.

As illustrated in FIG. 11, the first, second, and third drive signal terminals 8310 to 8330, 8410 to 8430, and 8510 to 8530 are provided on the exposed portion 292, the first, second, and third detection signal terminals 8340, 8350, 8440, 8450, 8540, and 8550 are provided on the exposed portion 291, and the first, second, and third pickup signal terminals 8360, 8370, 8460, 8470, 8560, and 8570 are provided on the exposed portion 292. That is, the first, second, and third drive signal terminals 8310 to 8330, 8410 to 8430, and 8510 to 8530, the first, second, and third pickup signal terminals 8360, 8370, 8460, 8470, 8560, and 8570, and the first, second, and third detection signal terminals 8340, 8350, 8440, 8450, 8540, and 8550 are provided at opposite sides with the lid 6 interposed therebetween in plan view from the Z-axis direction.

By disposing the terminals 8310 to 8370, 8410 to 8470, and 8510 to 8570 in this way, the first, second, and third detection signal terminals 8340, 8350, 8440, 8450, 8540, and 8550 can be disposed sufficiently apart from the first, second, and third drive signal terminals 8310 to 8330, 8410 to 8430, and 8510 to 8530. For that reason, it becomes difficult for the drive signals V11, V12, and V13 input from the first, second, and third drive signal terminals 8310 to 8330, 8410 to 8430, and 8510 to 8530 to be mixed into the detection signals detected from the first, second, and third detection signal terminals 8340, 8350, 8440, 8450, 8540, and 8550 as noise, and degradation of the S/N ratio of the detection signals can be suppressed. Since the detection signals are very weak signals with respect to the drive signals V11, V12, and V13, the effect described above is exceptional.

Furthermore, the first, second, and third detection signal terminals 8340, 8350, 8440, 8450, 8540, and 8550 can be disposed sufficiently apart from the first, second, and third pickup signal terminals 8360, 8370, 8460, 8470, 8560, and 8570. For that reason, it becomes difficult for the first and second pickup signals detected from the first, second, and third pickup signal terminals 8360, 8370, 8460, 8470, 8560, and 8570 to be mixed into the detection signals detected from the first, second, and third detection signal terminals 8340, 8350, 8440, 8450, 8540, and 8550 as noise, and degradation of the S/N ratio of the detection signals can be suppressed.

As described above, in the inertial sensor 1 of the fourth embodiment, the sensor element 300 as the first inertial sensor element is a gyro sensor element that measures an angular velocity, and includes the drive movable bodies 301A and 301B that vibrate with respect to the substrate 2. The inertial sensor 1 includes the first pickup signal terminals 8360 and 8370 that are provided outside the lid 6 and are for pickup signals corresponding to vibrations of the drive movable bodies 301A and 301B detected by the sensor element 300. The first pickup signal terminals 8360 and 8370 are positioned at the same side as the first drive signal terminals 8310 to 8330 with respect to the lid 6, that is, on the plus side in the X-axis direction. With this configuration, the first detection signal terminals 8340 and 8350 can be disposed sufficiently apart from the first pickup signal terminals 8360 and 8370. For that reason, it becomes difficult for the pickup signals detected from the first pickup signal terminals 8360 and 8370 to be mixed into the detection signals detected from the first detection signal terminals 8340 and 8350 as noise, and degradation of the S/N ratio of the detection signals can be suppressed.

According to the fourth embodiment as described above, the same effect as that of the first embodiment described above can also be exhibited.

Fifth Embodiment

Figure 16:
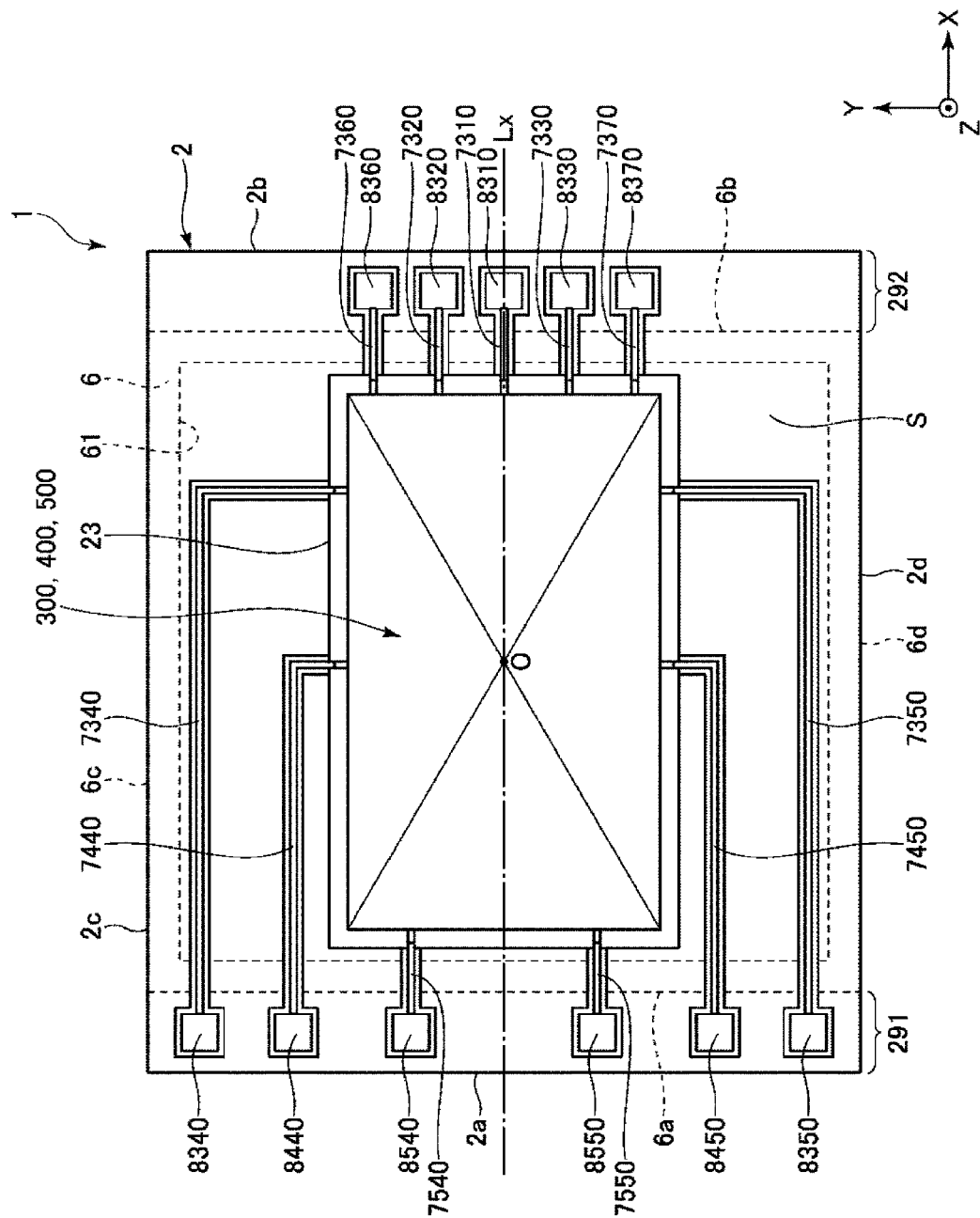
FIG. 16 is a plan view illustrating an inertial sensor according to a fifth embodiment.
Figure 17:
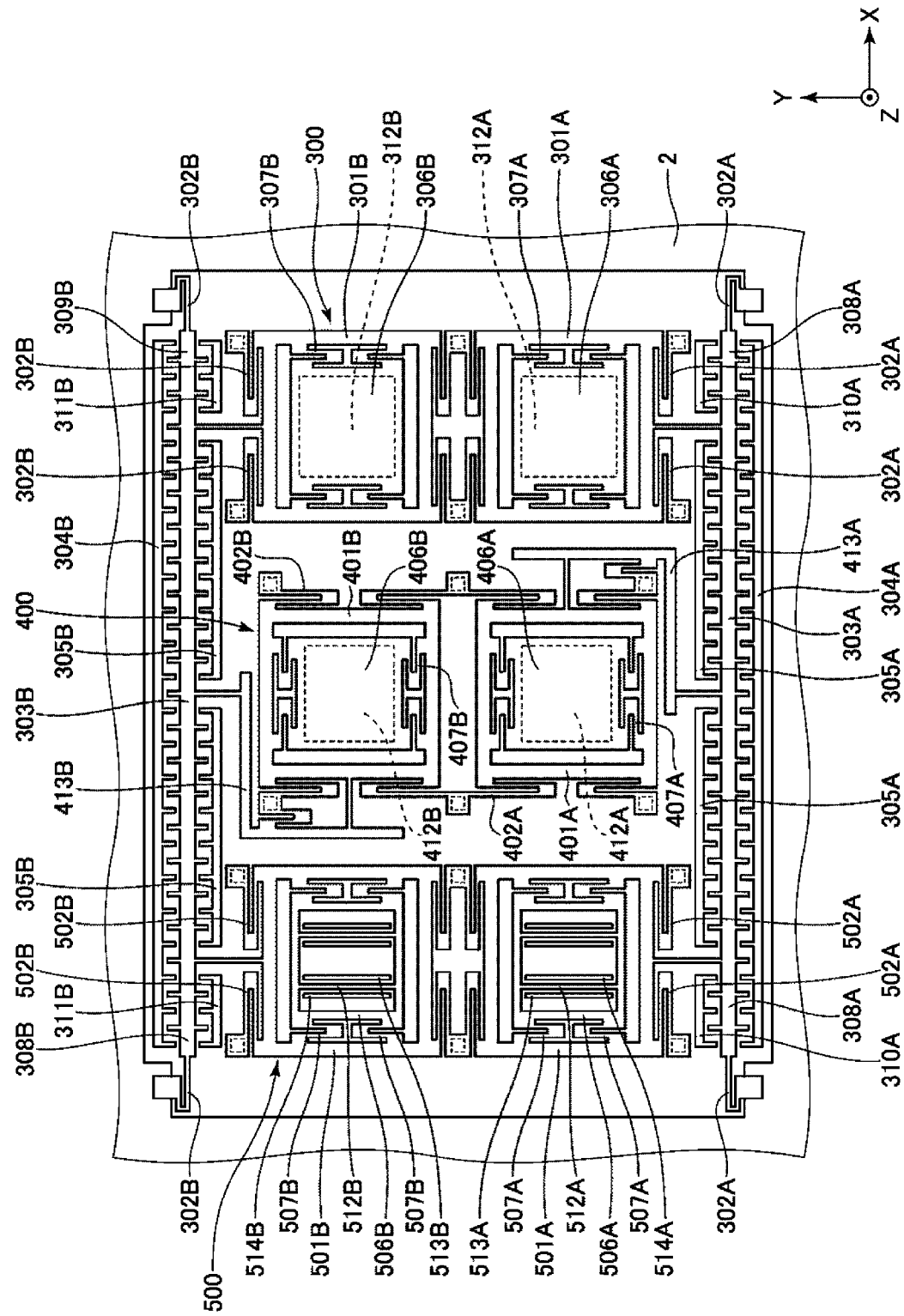
FIG. 17 is a plan view illustrating an example of the sensor element.

FIG. 16 is a plan view illustrating an inertial sensor of the fifth embodiment. FIG. 17 is a plan view illustrating an example of a sensor element. In FIG. 16, for convenience of explanation, the sensor elements 300, 400, and 500 are illustrated in a simplified manner.

The fifth embodiment is the same as the first and fourth embodiments described above, except that the sensor elements 300, 400, and 500 of the fourth embodiment described above are integrated. In the following description, the fifth embodiment will be described with a focus on differences from the embodiments described above, and description of similar matters will be omitted. In FIGS. 16 to 17, the same reference numerals are given to the same configurations as those of the embodiments described above.

In the inertial sensor 1 illustrated in FIG. 16, three sensor elements 300, 400, and 500 are integrated. As illustrated in FIG. 17, the movable drive electrodes 303A and 303B, the first and second fixed drive electrodes 304A, 304B, 305A, and 305B, the first and second movable monitor electrodes 308A, 308B, 309A, and 309B, and the first and second fixed monitor electrodes 310A, 310B, 311A, and 311B of the sensor element 300 also serve as corresponding portions of the sensor elements 400 and 500. For that reason, compared to the configuration of the fourth embodiment described above, the movable drive electrodes 403A and 403B, the first and second fixed drive electrodes 404A, 404B, 405A, and 405B, the first and second movable monitor electrodes 408A, 408B, 409A, and 409B, and the first and second fixed monitor electrodes 410A, 410B, 411A, and 411B are omitted from the sensor element 400, and the movable drive electrodes 503A and 503B, the first and second fixed drive electrodes 504A, 504B, 505A, and 505B, the first and second movable monitor electrodes 508A, 508B, 509A, and 509B, and the first and second fixed monitor electrodes 510A, 510B, 511A, and 511B are omitted from the sensor element 500.

As illustrated in FIG. 17, the sensor element 300 includes the frame-like drive movable bodies 301A and 301B, drive springs 302A and 302B for supporting the drive movable bodies 301A and 301B so as to vibrate in the Y-axis direction, movable drive electrodes 303A and 303B coupled to the drive movable bodies 301A and 301B, first and second fixed drive electrodes 304A and 305A disposed with the movable drive electrode 303A interposed therebetween, first and second fixed drive electrodes 304B and 305B disposed with the movable drive electrode 303B interposed therebetween, detection movable bodies 306A and 306B provided inside the drive movable bodies 301A and 301B, detection springs 307A and 307B coupling the detection movable bodies 306A and 306B and the drive movable bodies 301A and 301B, first movable monitor electrode 308A provided on the movable drive electrode 303A, second movable monitor electrode 309B provided on the movable drive electrode 303B, first fixed monitor electrode 310A disposed to face the first movable monitor electrode 308A, and second fixed monitor electrode 311B disposed to face the second movable monitor electrodes 309B. The fixed detection electrodes 312A and 312B are disposed on the bottom surface of the concave portion 23 so as to face the drive movable bodies 301A and 301B.

Although not illustrated, the detection movable bodies 306A and 306B are electrically coupled to the wiring 7310, the first fixed drive electrodes 304A and 304B are electrically coupled to the wiring 7320, the second fixed drive electrodes 305A and 305B are electrically coupled to the wiring 7330, the fixed detection electrode 312A is electrically coupled to the wiring 7340, the fixed detection electrode 312B is electrically coupled to the wiring 7350, the first fixed monitor electrode 310A is electrically coupled to the wiring 7360, and the second fixed monitor electrode 311B is electrically coupled to the wiring 7370.

The sensor element 400 includes the frame-like drive movable bodies 401A and 401B, drive springs 402A and 402B for supporting the drive movable bodies 401A and 401B so as to vibrate in the X-axis direction, detection movable bodies 406A and 406B disposed inside the drive movable bodies 401A and 401B, detection springs 407A and 407B coupling the detection movable bodies 406A and 406B and the drive movable bodies 401A and 401B, conversion units 413A and 413B that are provided between the movable drive electrodes 303A and 303B and the drive movable bodies 401A and 401B and convert vibrations in the Y-axis direction of the movable drive electrodes 303A and 303B into vibrations in the X-axis direction. The fixed detection electrodes 412A and 412B are disposed on the bottom surface of the concave portion 23 so as to face the drive movable bodies 401A and 401B.

Although not illustrated, the fixed detection electrode 412A is electrically coupled to the wiring 7440, and the fixed detection electrode 412B is electrically coupled to the wiring 7450.

The sensor element 500 includes the frame-like drive movable bodies 501A and 501B, drive springs 502A and 502B for supporting the drive movable bodies 501A and 501B so as to vibrate in the Y-axis direction, frame-like detection movable bodies 506A and 506B disposed inside the drive movable bodies 501A and 501B, detection springs 507A and 507B coupling the detection movable bodies 506A and 506B and the drive movable bodies 501A and 501B, movable detection electrodes 512A and 512B supported by the detection movable bodies 506A and 506B, first and second fixed detection electrodes 513A and 514A disposed with the movable detection electrode 512A interposed therebetween, and first and second fixed detection electrodes 513B and 514B disposed with the movable detection electrode 512B interposed therebetween.

Although not illustrated, the first fixed detection electrodes 513A and 513B are electrically coupled to the wiring 7540, and the second fixed detection electrodes 514A and 514B are electrically coupled to the wiring 7550.

According to such a configuration, a part of the sensor elements 400 and 500 can be omitted, so that the inertial sensor 1 can be reduced in size as compared with the fourth embodiment described above. As illustrated in FIG. 16, the wirings 7340 and 7350 can be disposed symmetrically with respect to the center line Lx that passes through the center O of the inertial sensor 1 and extends in the X-axis direction, and it becomes easy to design the lengths of the wirings 7340 and 7350 equal to each other. The same applies to the wirings 7440 and 7450, and the same applies to the wirings 7540 and 7550.

Sixth Embodiment

Figure 18:
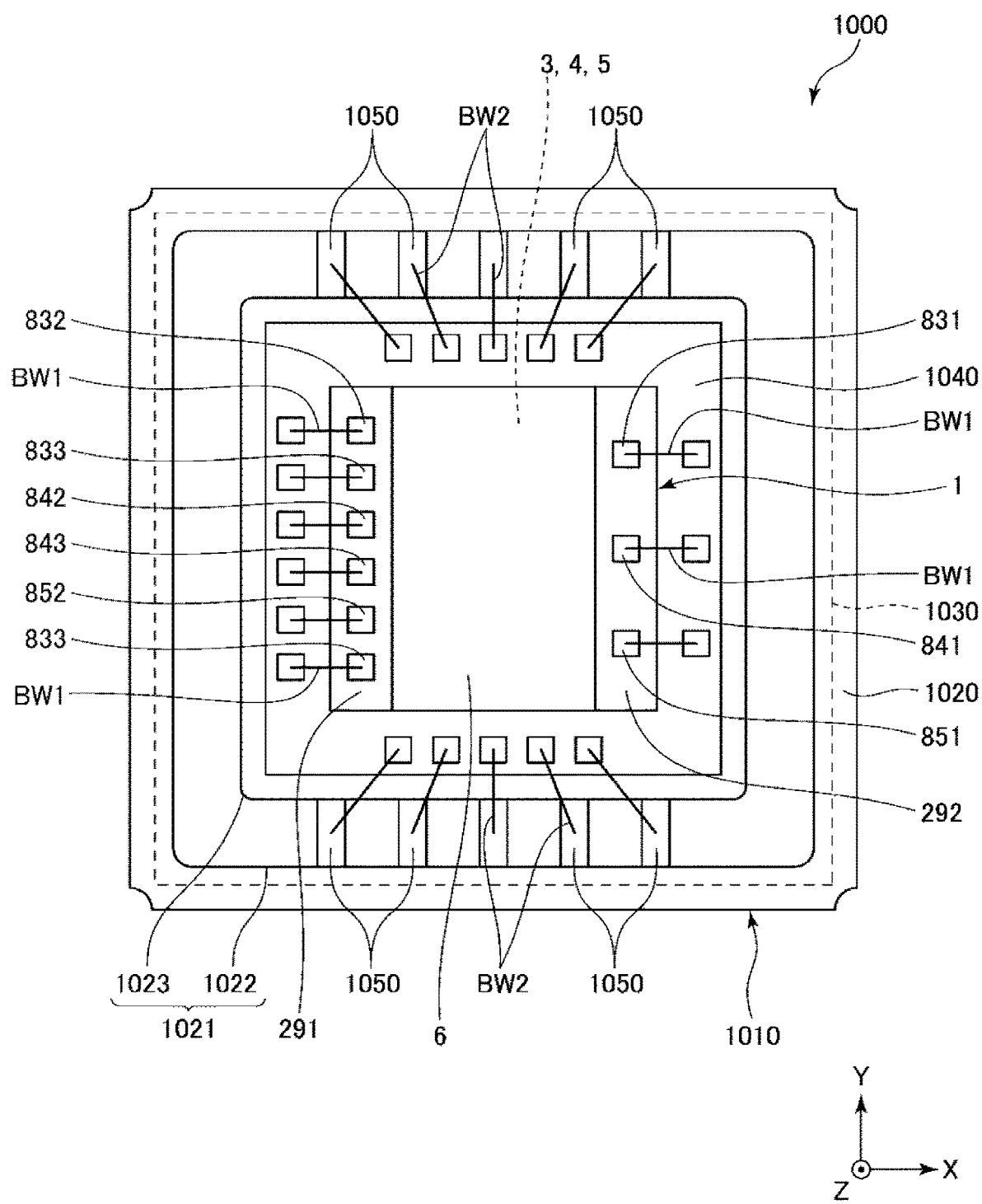
FIG. 18 is a plan view illustrating an inertial sensor unit according to a sixth embodiment.
Figure 19:
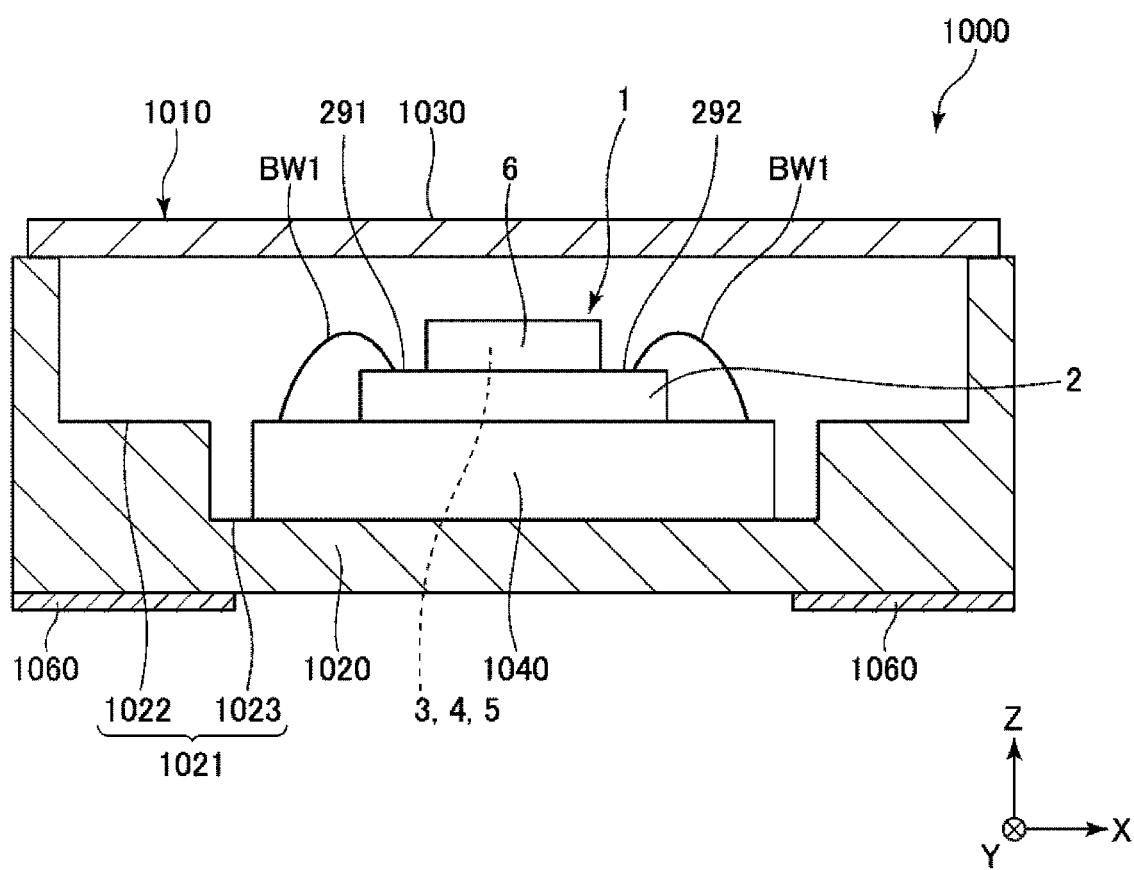
FIG. 19 is a cross-sectional view of the inertial sensor unit illustrated in FIG. 18.

FIG. 18 is a plan view illustrating an inertial sensor unit of the sixth embodiment. FIG. 19 is a cross-sectional view of the inertial sensor unit illustrated in FIG. 18.

An inertial sensor unit 1000 illustrated in FIGS. 18 and 19 includes a package 1010, an IC chip 1040 and an inertial sensor 1 that are accommodated in the package 1010. In the IC chip 1040, for example, a drive control circuit that controls driving of the inertial sensor 1 and a detection circuit that measures accelerations Ax, Ay, and Az based on detection signals from the inertial sensor 1 are included. In the sixth embodiment, the configuration of the first embodiment described above is used as the configuration of the inertial sensor 1, but the configuration of the inertial sensor 1 is not particularly limited thereto and may be any of those configurations of other embodiments.

The package 1010 includes a base substrate 1020 having a concave portion 1021 which opens to the upper surface, and a lid 1030 bonded to the upper surface of the base substrate 1020 so as to close the opening of the concave portion 1021. The concave portion 1021 includes a first concave portion 1022 which opens to the upper surface of the base substrate 1020 and a second concave portion 1023 which opens to the bottom surface of the first concave portion 1022. An IC chip 1040 is mounted on the bottom surface of the second concave portion 1023 and the inertial sensor 1 is mounted on the IC chip 1040. The terminals 831 to 833, 841 to 843, and 851 to 853 of the inertial sensor 1 are electrically coupled to corresponding terminals of IC chip 1040 through bonding wires BW1. Since the terminals 831 to 833, 841 to 843, and 851 to 853 of the inertial sensor 1 are disposed as described above, it becomes difficult for noise to be mixed into the detection signal detected from the inertial sensor 1.

A plurality of internal terminals 1050 that are electrically coupled to the IC chip 1040 through bonding wires BW2 are disposed on the bottom surface of the first concave portion 1022. A plurality of external terminals 1060 that are electrically coupled to a plurality of internal terminals 1050 through internal wirings (not illustrated) disposed in the base substrate 1020 are disposed on the lower surface of the base substrate 1020.

Such an inertial sensor unit 1000 includes the inertial sensor 1. For that reason, the effects of the inertial sensor 1 described above can be obtained and high reliability can be exhibited.

Seventh Embodiment

Figure 20:
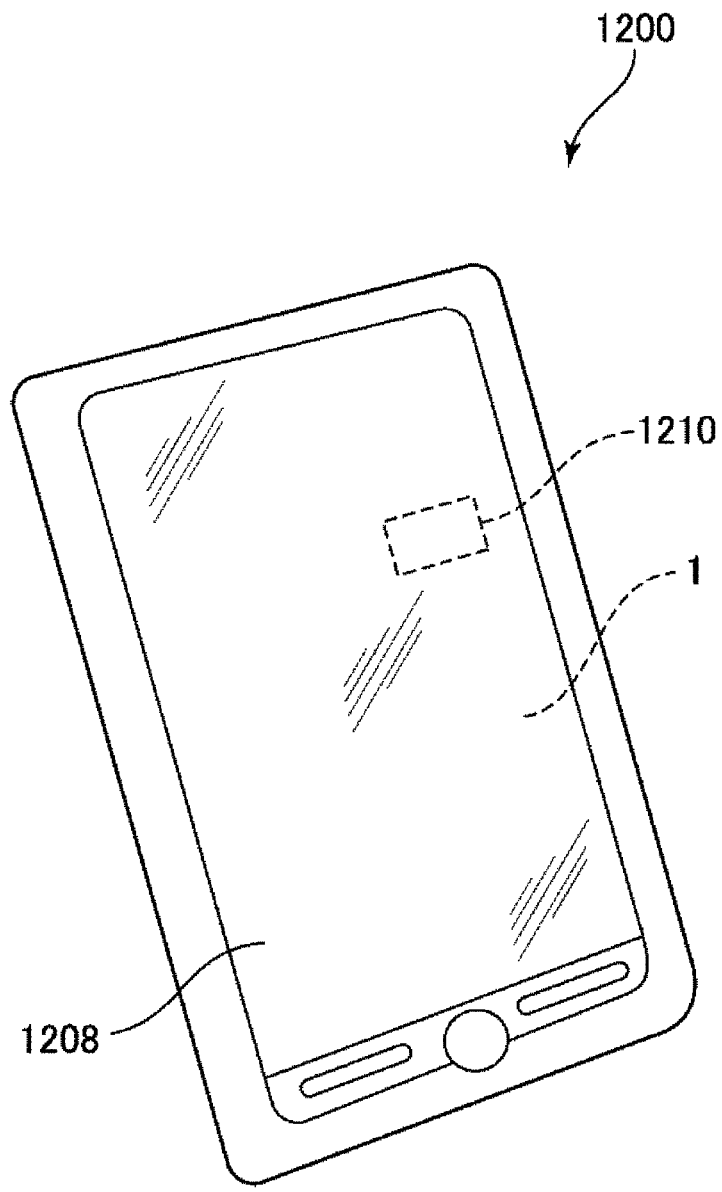
FIG. 20 is a plan view illustrating a smartphone according to a seventh embodiment.

FIG. 20 is a plan view illustrating a smartphone of a seventh embodiment.

In the smartphone 1200 illustrated in FIG. 20, the inertial sensor 1 and a control circuit 1210 that performs control based on detection signals detected from the inertial sensor 1 are incorporated. Detection data detected by the inertial sensor 1 is transmitted to the control circuit 1210, and the control circuit 1210 can recognize the attitude and behavior of the smartphone 1200 from the received detection data, change a display image displayed on a display unit 1208, generate an alarm sound or sound effect, or drive the vibration motor to vibrate the main body.

The smartphone 1200 as such an electronic apparatus includes the inertial sensor 1 and the control circuit 1210 that performs control based on a detection signal output from the inertial sensor 1. For that reason, the effect of the inertial sensor 1 described above can be obtained and high reliability can be exhibited.

The electronic apparatus incorporating the inertial sensor 1 is not particularly limited, and includes, for example, a personal computer, a digital still camera, a tablet terminal, a timepiece, a smartwatch, an ink jet printer, a laptop personal computer, a TV, a wearable terminals such as HMD (head mounted display), a video camera, a video tape recorder, a car navigation device, a pager, an electronic datebook, an electronic dictionary, a calculator, an electronic game machine, a word processor, a work station, a videophone, a security TV monitor, electronic binoculars, a POS terminal, medical equipment, a fish finder, various measuring instruments, mobile terminal base station equipment, various instruments of vehicles, aircraft, and ships, a flight simulator, a network server, and the like, in addition to the smartphone 1200.

Eighth Embodiment

Figure 21:
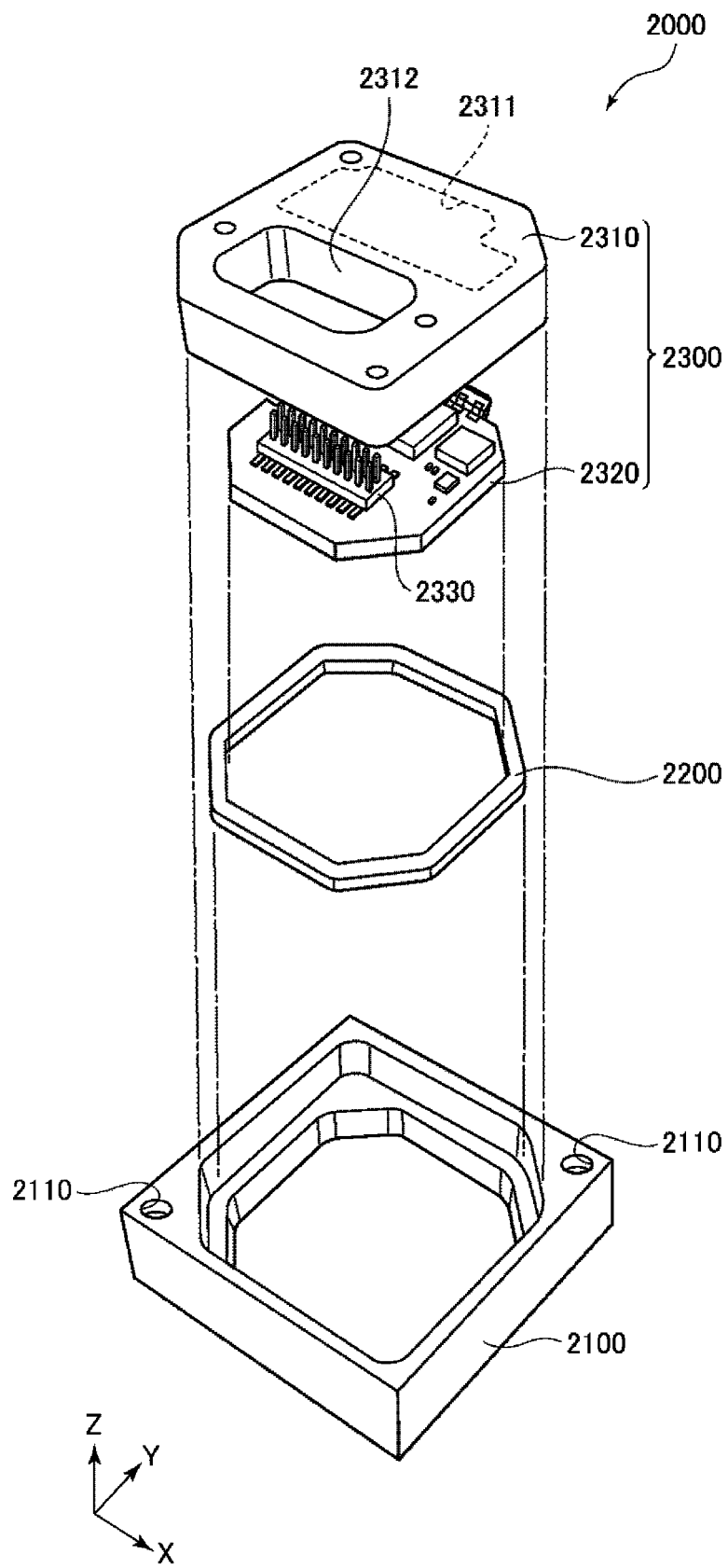
FIG. 21 is an exploded perspective view illustrating an inertial measurement device according to an eighth embodiment.
Figure 22:
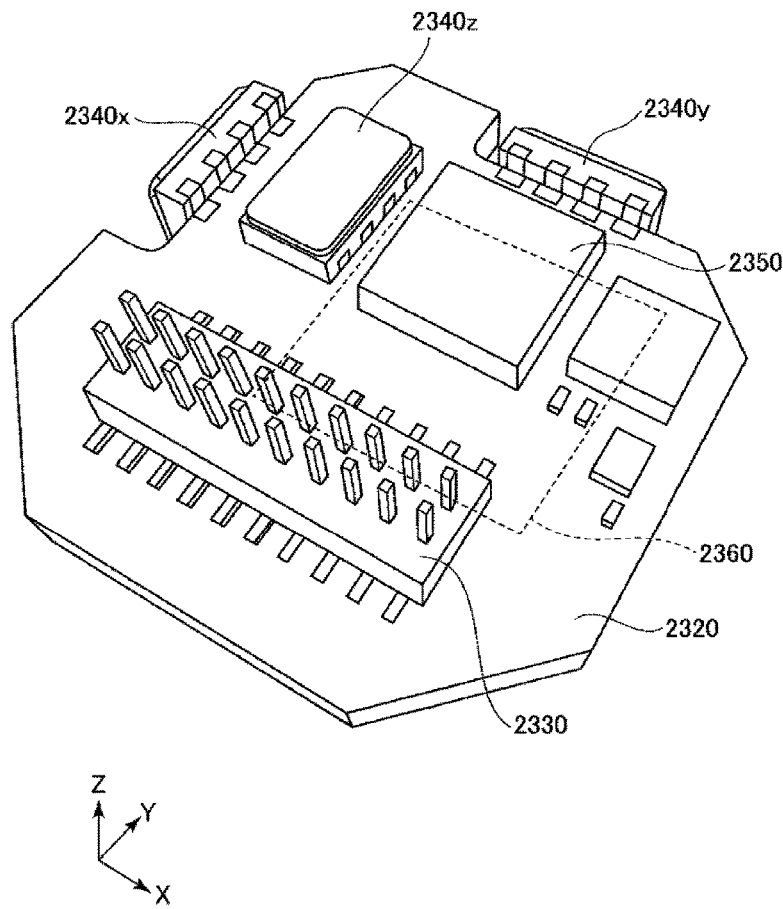
FIG. 22 is a perspective view of a substrate included in the inertial measurement device illustrated in FIG. 21.

FIG. 21 is an exploded perspective view illustrating an inertia measurement device according to an eighth embodiment. FIG. 22 is a perspective view of a substrate included in the inertia measurement device illustrated in FIG. 21.

An inertia measurement device 2000 (IMU: Inertial measurement Unit) illustrated in FIG. 21 is an inertia measurement device that detects the attitude and behavior of amounted device such as an automobile or a robot. The inertia measurement device 2000 functions as a six-axis motion sensor including three-axis acceleration sensors and three-axis angular velocity sensors.

The inertia measurement device 2000 is a rectangular parallelepiped having a substantially square planar shape. Screw holes 2110 as fixed portions are formed in the vicinity of two vertices positioned in the diagonal direction of the square. Through two screws in the two screw holes 2110, the inertia measurement device 2000 can be fixed to the mounted surface of the mounted object such as an automobile. The size of the inertia measurement device 2000 can be reduced such that the device can be mounted on a smartphone or a digital still camera, for example, by selection of parts or design change.

The inertia measurement device 2000 has a configuration in which an outer case 2100, a bonding member 2200, and a sensor module 2300 are included and the sensor module 2300 is inserted in the outer case 2100 with the bonding member 2200 interposed therebetween. Similarly to the overall shape of the inertia measurement device 2000 described above, the outer shape of the outer case 2100 is a rectangular parallelepiped having a substantially square planar shape, and screw holes 2110 are formed in the vicinity of two vertices positioned in the diagonal direction of the square. In addition, the outer case 2100 has a box shape and the sensor module 2300 is accommodated therein.

Further, the sensor module 2300 includes an inner case 2310 and a substrate 2320. The inner case 2310 is a member for supporting the substrate 2320, and has a shape that fits inside the outer case 2100. A concave portion 2311 for suppressing contact with the substrate 2320 and an opening 2312 for exposing a connector 2330 described later are formed in the inner case 2310. Such an inner case 2310 is bonded to the outer case 2100 through the bonding member 2200. The substrate 2320 is bonded to the lower surface of the inner case 2310 through an adhesive.

As illustrated in FIG. 21, a connector 2330, an angular velocity sensor 2340z for measuring the angular velocity around the Z-axis, an acceleration sensor 2350 for measuring acceleration in each axis direction of the X-axis, the Y-axis, and the Z-axis and the like are mounted on the upper surface of the substrate 2320. An angular velocity sensor 2340x for measuring the angular velocity around the X-axis and an angular velocity sensor 2340y for measuring the angular velocity around the Y-axis are mounted on the side surface of the substrate 2320. As these sensors, the inertial sensor of the embodiments can be used.

A control IC 2360 is mounted on the lower surface of the substrate 2320. The control IC 2360 is a micro controller unit (MCU) and controls each unit of the inertia measurement device 2000. In the storing unit, programs defining the order and contents for measuring the acceleration and angular velocity, programs for digitizing detected data and incorporating the detected data into packet data, accompanying data, and the like are stored. In addition, a plurality of electronic components are mounted on the substrate 2320.

Ninth Embodiment

Figure 23:
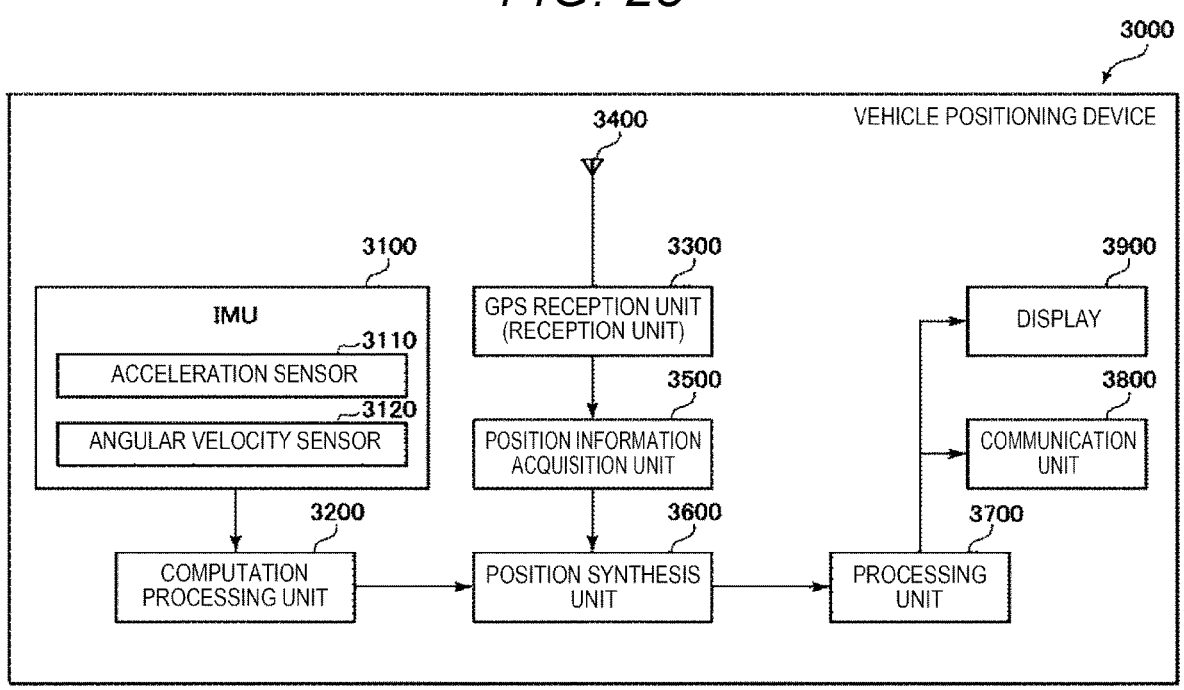
FIG. 23 is a block diagram illustrating an entire system of a vehicle positioning device according to a ninth embodiment.
Figure 24:
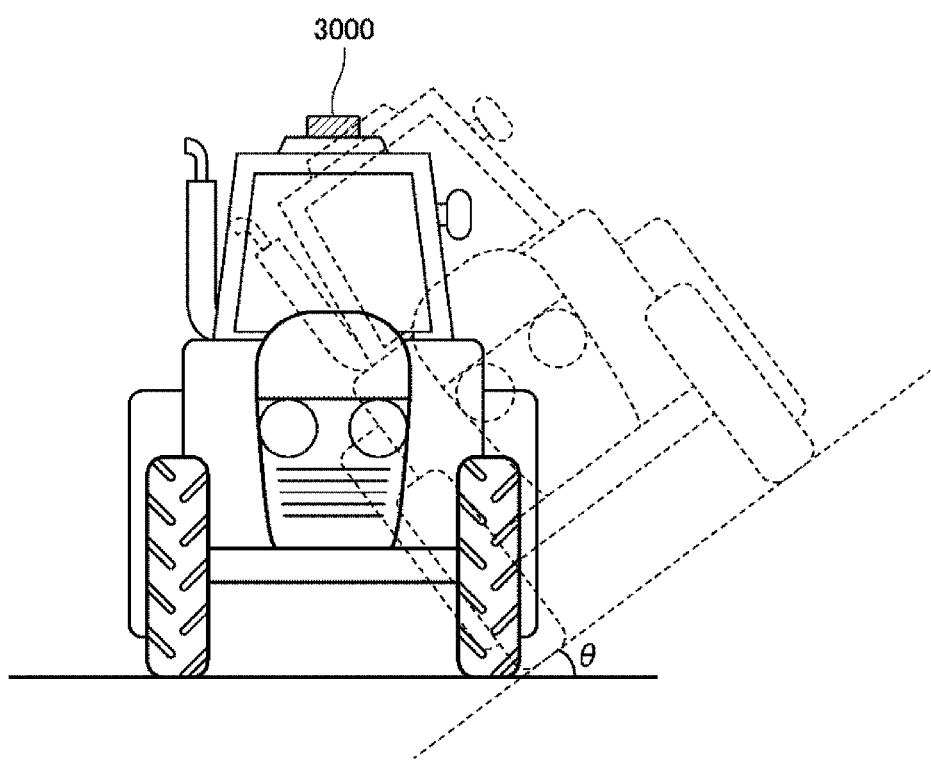
FIG. 24 is a diagram illustrating an operation of the vehicle positioning device illustrated in FIG. 23.

FIG. 23 is a block diagram illustrating the entire system of a vehicle positioning device according to a ninth embodiment. FIG. 24 is a diagram illustrating the operation of the vehicle positioning device illustrated in FIG. 23.

A vehicle positioning device 3000 illustrated in FIG. 23 is a device which is used by being mounted on a vehicle and performs positioning of the vehicle. The vehicle is not particularly limited, and may be any of a bicycle, an automobile, a motorcycle, a train, an airplane, a ship, and the like, but in the seventh embodiment, description will be made on a four-wheeled automobile as the vehicle.

The vehicle positioning device 3000 includes an inertia measurement device 3100 (IMU), a computation processing unit 3200, a GPS reception unit 3300, a receiving antenna 3400, a position information acquisition unit 3500, a position synthesis unit 3600, a processing unit 3700, a communication unit 3800, and a display 3900. As the inertia measurement device 3100, for example, the inertia measurement device 2000 described above can be used.

The inertia measurement device 3100 includes a tri-axis acceleration sensor 3110 and a tri-axis angular velocity sensor 3120. The computation processing unit 3200 receives acceleration data from the acceleration sensor 3110 and angular velocity data from the angular velocity sensor 3120, performs inertial navigation computation processing on these data, and outputs inertial navigation positioning data including acceleration and attitude of the vehicle.

The GPS reception unit 3300 receives a signal from the GPS satellite through the receiving antenna 3400. Further, the position information acquisition unit 3500 outputs GPS positioning data representing the position (latitude, longitude, altitude), speed, direction of the vehicle positioning device 3000 based on the signal received by the GPS reception unit 3300. The GPS positioning data also includes status data indicating a reception state, a reception time, and the like.

Based on inertial navigation positioning data output from the computation processing unit 3200 and the GPS positioning data output from the position information acquisition unit 3500, the position synthesis unit 3600 calculates the position of the vehicle, more specifically, the position on the ground where the vehicle is traveling. For example, even if the position of the vehicle included in the GPS positioning data is the same, as illustrated in FIG. 24, if the attitude of the vehicle is different due to the influence of inclination θ of the ground or the like, the vehicle is traveling at different positions on the ground. For that reason, it is impossible to calculate an accurate position of the vehicle with only GPS positioning data. Therefore, the position synthesis unit 3600 calculates the position on the ground where the vehicle is traveling, using inertial navigation positioning data.

The position data output from the position synthesis unit 3600 is subjected to predetermined processing by the processing unit 3700 and displayed on the display 3900 as a positioning result. Further, the position data may be transmitted to the external apparatus by the communication unit 3800.

Tenth Embodiment

Figure 25:
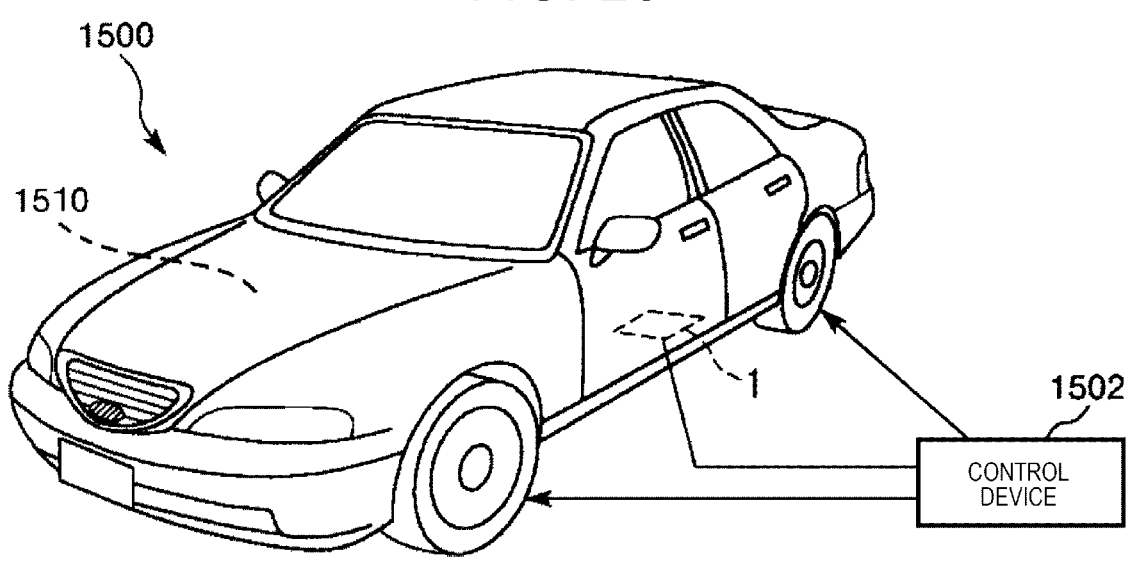
FIG. 25 is a perspective view illustrating a vehicle according to a tenth embodiment.

FIG. 25 is a perspective view illustrating a vehicle according to a tenth embodiment of the disclosure.

An automobile 1500 as the vehicle illustrated in FIG. 25 includes at least one system 1510 of an engine system, a brake system, and a keyless entry system. The inertial sensor 1 is incorporated in the automobile 1500, and the attitude of the vehicle body can be measured by the inertial sensor 1. The detection signal of the inertial sensor 1 is supplied to the control device 1502, and the control device 1502 can control the system 1510 based on the signal.

As such, the automobile 1500 as the vehicle includes the inertial sensor 1 and the control device 1502 that performs control based on the detection signal output from the inertial sensor 1. For that reason, the effect of the inertial sensor 1 described above can be obtained and high reliability can be exhibited.

In addition, the inertial sensor 1 can also be widely applied to a car navigation system, a car air conditioner, an anti-lock braking system (ABS), an air bag, a tire pressure monitoring system (TPMS), an engine controller, and an electronic control unit (ECU) such as a battery monitor of a hybrid car or an electric automobile. Also, the vehicle is not limited to the automobile 1500, but can also be applied to an airplane, a rocket, a satellite, a ship, an automated guided vehicle (AGV), a biped walking robot, an unmanned airplane such as a drone, and the like.

Although the inertial sensor according to the present disclosure, the electronic apparatus, and the vehicle according to the present disclosure have been described based on the embodiments, the disclosure is not limited thereto. The configuration of each unit can be replaced with any configuration having the same function.

What is claimed is:

1. An inertial sensor comprising:
   a substrate;
   a first single-dimensional inertial sensor element provided on the substrate and configured to measure in or about a first direction;
   a second single-dimensional inertial sensor element also provided on the substrate and configured to measure in or about a second direction that is different than the first direction;
   a lid bonded to the substrate so as to cover the first single-dimensional inertial sensor element and the second single-dimensional inertial sensor element;
   a first drive signal terminal that is provided outside the lid and is for a first drive signal to be applied to the first single-dimensional inertial sensor element;
   a first detection signal terminal that is provided outside the lid and is for a first detection signal output from the first single-dimensional inertial sensor element, wherein in plan view of the substrate, the first drive signal terminal and the first detection signal terminal are provided with the lid interposed therebetween;

a second drive signal terminal that is provided outside the lid and is for a second drive signal to be applied to the second single-dimensional inertial sensor element; and a second detection signal terminal that is provided outside the lid and is for a second detection signal output from the second single-dimensional inertial sensor element, wherein in plan view of the substrate, the second drive signal terminal and the second detection signal terminal are provided with the lid interposed therebetween, all of the drive signal terminals of the first single-dimensional inertial sensor element and second single-dimensional inertial sensor element are positioned at the same first side with respect to the lid such that the second drive signal terminal is positioned at the same first side as the first drive signal terminal with respect to the lid, and all of the detection signal terminals of the first single-dimensional inertial sensor element and second single-dimensional inertial sensor element are positioned at the same second side with respect to the lid, the first side and the second side being different sides of the lid, such that the second detection signal terminal is positioned at the same second side as the first detection signal terminal with respect to the lid.

2. The inertial sensor according to claim 1, wherein
the first single-dimensional inertial sensor element is a gyro sensor element measuring an angular velocity, and includes a drive movable body that vibrates with respect to the substrate and the inertial sensor further comprises a first pickup signal terminal that is provided at the outside of the lid and is for a pickup signal corresponding to vibration of the drive movable body output from the first single-dimensional inertial sensor element, and the first pickup signal terminal is positioned at the same side as the first drive signal terminal with respect to the lid.

3. The inertial sensor according to claim 1, wherein
a pair of detection signal terminals including the first detection signal terminal and a third detection signal terminal, the inertial sensor further comprises a first detection signal wiring that electrically couples the first detection signal terminal and the first single-dimensional inertial sensor element; and a second detection signal wiring that electrically couples the third detection signal terminal and the first single-dimensional inertial sensor element, and the first detection signal wiring and the second detection signal wiring have the same length.

4. The inertial sensor according to claim 1, wherein
each of the first drive signal terminal and the first detection signal terminal is made of a metal film provided on the substrate.

5. The inertial sensor according to claim 1, wherein
each of the first drive signal terminal and the first detection signal terminal is provided on the substrate and provided on a mounting table made of the same material as the first inertial sensor element.

6. The inertial sensor according to claim 1, further comprising:
a bonding member that is provided between the substrate and the lid and bonds the substrate and the lid, wherein
the bonding member contains the same material as the first drive signal terminal and the first detection signal terminal.

7. The inertial sensor according to claim 1, further comprising:
a plurality of inspection terminals that are coupled to the first drive signal terminal and the first detection signal terminal, respectively, and have different shapes in plan view from the first drive signal terminal and the first detection signal terminal.

8. The inertial sensor according to claim 7, wherein
the shapes of the plurality of inspection terminals are rotationally symmetric in plan view.

9. An electronic apparatus comprising:
the inertial sensor according to claim 1; and
a control circuit that performs control based on a detection signal output from the inertial sensor.

10. A vehicle comprising:
the inertial sensor according to claim 1; and
a control device that performs control based on a detection signal output from the inertial sensor.

11. The inertial sensor according to claim 1, the first single-dimensional inertial sensor configured measure acceleration in the first direction, the second single-dimensional inertial sensor measuring acceleration in the second direction.

12. The inertial sensor according to claim 1, the first single-dimensional inertial sensor configured to measure angular velocity about the first direction, the second single-dimensional inertial sensor configured to measure angular velocity about the second direction.

* * * * *